(12) United States Patent
Choi et al.

(10) Patent No.: US 12,144,179 B2
(45) Date of Patent: Nov. 12, 2024

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventors: Eun Seok Choi, Icheon-si (KR); Seo Hyun Kim, Icheon-si (KR); Dong Hwan Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 414 days.

(21) Appl. No.: 17/545,544

(22) Filed: Dec. 8, 2021

(65) Prior Publication Data

US 2023/0005952 A1    Jan. 5, 2023

(30) Foreign Application Priority Data

Jul. 2, 2021   (KR) .................. 10-2021-0087392

(51) Int. Cl.
*H10B 43/27*     (2023.01)
*H01L 23/00*     (2006.01)
(Continued)

(52) U.S. Cl.
CPC ............. *H10B 43/27* (2023.02); *H01L 24/08* (2013.01); *H01L 24/80* (2013.01); *H01L 25/0657* (2013.01); *H01L 25/18* (2013.01); *H01L 25/50* (2013.01); *H10B 41/27* (2023.02); *H01L 2224/08145* (2013.01);
(Continued)

(58) Field of Classification Search
CPC ........ H10B 43/27; H10B 41/27; H10B 41/41; H10B 43/40; H01L 24/08; H01L 25/0657; H01L 25/18; H01L 2224/08145; H01L 2224/80895; H01L 2224/80896; H01L 2924/1431; H01L 2924/14511; H01L 25/50; H01L 24/80
See application file for complete search history.

(56) References Cited

U.S. PATENT DOCUMENTS 10,629,616 B1    4/2020  Kai et al.
2017/0330887 A1  11/2017  Kim et al.
(Continued)

FOREIGN PATENT DOCUMENTS

KR    1020100133671 A    12/2010
KR    1020120006843 A     1/2012
(Continued)

*Primary Examiner* — Thanh Y. Tran
(74) *Attorney, Agent, or Firm* — WILLIAM PARK & ASSOCIATES LTD.

(57) ABSTRACT

There are provided a semiconductor memory device and a manufacturing method of the same. The semiconductor memory device includes: a stack structure including conductive patterns and interlayer insulating layers, which are alternately stacked in a first direction; a channel layer penetrating the stack structure; a first semiconductor layer disposed on the stack structure, the first semiconductor layer including a first impurity of a first conductivity type; a second semiconductor layer disposed on the first semiconductor layer, the second semiconductor layer including a well region with a second impurity of a second conductivity type, wherein the second conductivity type is different from the first conductivity type; and a memory layer between the channel layer and the stack structure.

22 Claims, 20 Drawing Sheets

(51) Int. Cl.
  *H01L 25/00*     (2006.01)
  *H01L 25/065*    (2023.01)
  *H01L 25/18*     (2023.01)
  *H10B 41/27*     (2023.01)

(52) U.S. Cl.
  CPC .............. *H01L 2224/80895* (2013.01); *H01L 2224/80896* (2013.01); *H01L 2924/1431* (2013.01); *H01L 2924/14511* (2013.01)

(56) References Cited

U.S. PATENT DOCUMENTS

| | | |
|---|---|---|
| 2019/0115362 A1 | 4/2019 | Choi et al. |
| 2020/0350326 A1 | 11/2020 | Yun et al. |
| 2021/0028184 A1 | 1/2021 | Kim et al. |
| 2022/0037352 A1 | 2/2022 | Zhang et al. |
| 2022/0310644 A1* | 9/2022 | Lee ........................ H10B 41/41 |

FOREIGN PATENT DOCUMENTS

| | | |
|---|---|---|
| KR | 1020220133011 A | 10/2022 |
| KR | 1020230006323 A | 1/2023 |

\* cited by examiner

SEMICONDUCTOR MEMORY DEVICE AND MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2021-0087392, filed on Jul. 2, 2021, in the Korean Intellectual Property Office, the entire disclosure of which is incorporated herein by reference.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device includes memory cells capable of storing data. A three-dimensional semiconductor memory device may include a three-dimensional memory cell array.

Various operations of memory cells are controlled by a peripheral circuit structure. The three-dimensional semiconductor memory device may include a peripheral circuit structure overlapping with the three-dimensional memory cell array. Due to structural limitation and limitation of manufacturing processes, an erase operation for erasing data that is stored in a memory cell may be limited to a gate induced drain leakage (GIDL) scheme using a GIDL current. The erase operation using the GIDL scheme is performed based on minority carriers, and therefore, the reliability of the erase operation may deteriorate.

SUMMARY

In accordance with an aspect of the present disclosure, there is provided a semiconductor memory device including: a stack structure including conductive patterns and interlayer insulating layers, which are alternately stacked in a first direction; a channel layer penetrating the stack structure; a first semiconductor layer disposed on the stack structure, the first semiconductor layer including a first impurity of a first conductivity type; a second semiconductor layer disposed on the first semiconductor layer, the second semiconductor layer including a well region with a second impurity of a second conductivity type, wherein the second conductivity type is different from the first conductivity type; and a memory layer between the channel layer and the stack structure, wherein the channel layer is in direct contact with the first semiconductor layer and well region of the second semiconductor layer.

In accordance with another aspect of the present disclosure, there is provided a method of manufacturing a semiconductor memory device, the method including: forming a cell plug with a memory layer that extends along a surface of a channel hole and a channel layer that is disposed on the memory layer in the channel hole, wherein the channel hole penetrates conductive patterns and interlayer insulating layers, which are alternately stacked on a substrate, and extends into the substrate; removing the substrate to expose a portion of the memory layer; removing the exposed portion of the memory layer to expose a portion of the channel layer; forming a first semiconductor layer that surrounds the exposed portion of the channel layer, the first semiconductor layer including a first impurity of a first conductivity type; and forming a second semiconductor layer on the first semiconductor layer, the second semiconductor layer including a well region in direct contact with the first semiconductor layer and the channel layer, wherein the well region of the second semiconductor layer includes a second impurity of a second conductivity type, the second conductivity type being different from the first conductivity type.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first", "second", etc. may be used herein to describe various elements, these elements are not limited by these terms. These terms are used for distinguishing one element from another element and not to suggest a number or order of elements.

Embodiments provide a semiconductor memory device with improved operational reliability and a manufacturing method of the semiconductor memory device.

Figure 1:
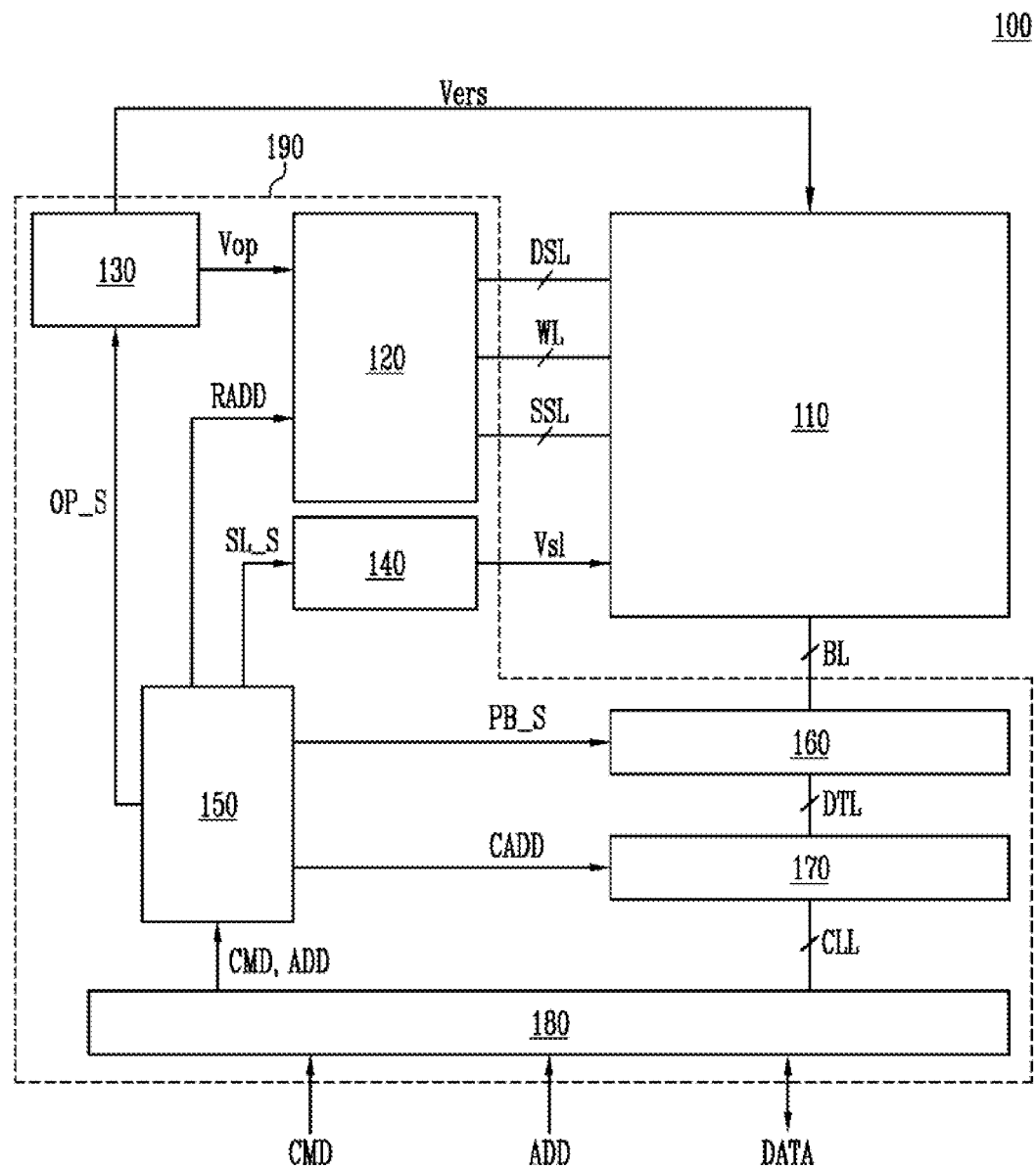
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 100 may include a peripheral circuit structure 190 and a memory cell array 110.

The peripheral circuit structure 190 may be configured to perform a program operation and a verify operation, which are used to store data in the memory cell array 110, a read operation for outputting data that is stored in the memory cell array 110, and an erase operation for erasing data that is stored in the memory cell array 110. The peripheral circuit structure 190 may include an input/output circuit 180, a control circuit 150, a voltage generating circuit 130, a row decoder 120, a column decoder 170, a page buffer 160, and a source line driver 140.

The memory cell array 110 may include a plurality of memory cell strings. Each memory cell string may include a plurality of memory cells in which data is stored. Each memory cell may store data of a single bit or two or more bits. The plurality of memory cells may be connected in series through a channel layer. The channel layer may be connected to the page buffer 160 via a bit line BL, corresponding thereto. The channel layer may be connected to a first semiconductor layer and a second semiconductor layer. The first semiconductor layer may be provided as a source region that is doped with a first impurity of a first conductivity type. The second semiconductor layer may include a well region with a second impurity of a second conductivity type different from the first conductivity type. The channel layer might not only be in direct contact with the first semiconductor layer that is provided as the source region but also be in direct contact with the well region of the second semiconductor layer. The first conductivity type may be an n type, and the second conductivity type may be a p type.

The input/output circuit 180 may transfer, to the control logic 150, a command CMD and an address ADD, which are transferred from an external device of the memory device 100 (e.g., a memory controller). The input/output circuit 180 may exchange data DATA with the external device and the column decoder 170.

The control logic 150 may output an operation signal OP_S, a row address RADD, a source line control signal SL_S, a page buffer control signal PB_S, and a column address CADD in response to the command CMD and the address ADD.

The voltage generating circuit 130 may generate various operating voltages Vop that are used for a program operation, a verify operation, a read operation, and an erase operation in response to the operation signal OP_S. The voltage generating circuit 130 may transmit an erase voltage Vers to the memory cell array 110 during an erase operation in response to the operation signal OP_S. During the erase operation, the erase voltage Vers may be transferred to the second semiconductor layer of the memory cell array 110. The second semiconductor layer may supply holes as majority carriers to the channel layer during the erase operation.

The row decoder 120 may be connected to the memory cell array 110 through a drain select line DSL, a word line WL, and a source select line SSL. The row decoder 120 may transfer the plurality of operating voltages Vop to a plurality of drain select lines DSL, a plurality of word lines WL, and a plurality of source select lines SSL in response to the row address RADD.

The column decoder 170 may transmit data DATA input from the input/output circuit 180 to the page buffer 160 or transmit data DATA that is stored in the page buffer 160 to the input/output circuit 180, in response to the column address CADD. The column decoder 170 may exchange data DATA with the input/output circuit 180 through a column line CLL. The column decoder 170 may exchange data DATA with the page buffer 160 through a data line DTL.

The page buffer 160 may be connected to the memory cell array 110 through a bit line BL. The page buffer 160 may temporarily store data DATA that is received through the bit line BL in response to the page buffer control signal PB_S. The page buffer 160 may sense a voltage or current of the bit line BL in a read operation.

The source line driver 140 may transmit a source voltage VsI to the memory cell array 110 in response to the source line control signal SL_S. In an embodiment, the source line driver 140 may supply a source voltage VsI that is discharged to the source region of the memory cell array 110 during a read operation or a verify operation. In an embodiment, the source voltage VsI for discharge may be a ground voltage.

Figure 2:
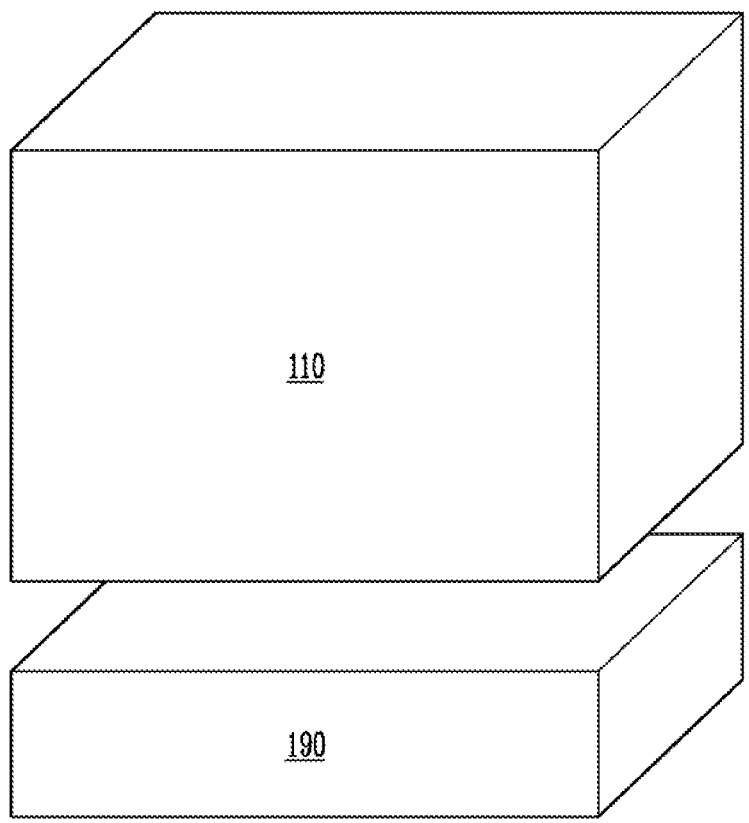
FIG. 2 is a view illustrating an embodiment of an arrangement of a memory cells array and a peripheral circuit structure, which are shown in FIG. 1.

FIG. 2 is a view illustrating an embodiment of an arrangement of the memory cells array and the peripheral circuit structure, which are shown in FIG. 1.

Referring to FIG. 2, the peripheral circuit structure 190 of the semiconductor memory device 100 may include a region that overlaps with the memory cell array 110. The direction in which the peripheral circuit structure 190 faces the memory cell array 110 may be defined as a first direction. In an embodiment, the peripheral circuit structure 190 may face the memory cell array 110 in a Z-axis direction of an XYZ coordinate system. The peripheral circuit structure 190 may be connected to the first semiconductor layer, the second semiconductor layer, a plurality of bit lines, the plurality of drain select lines, the plurality of word lines, and the plurality of source select lines.

Figure 3:
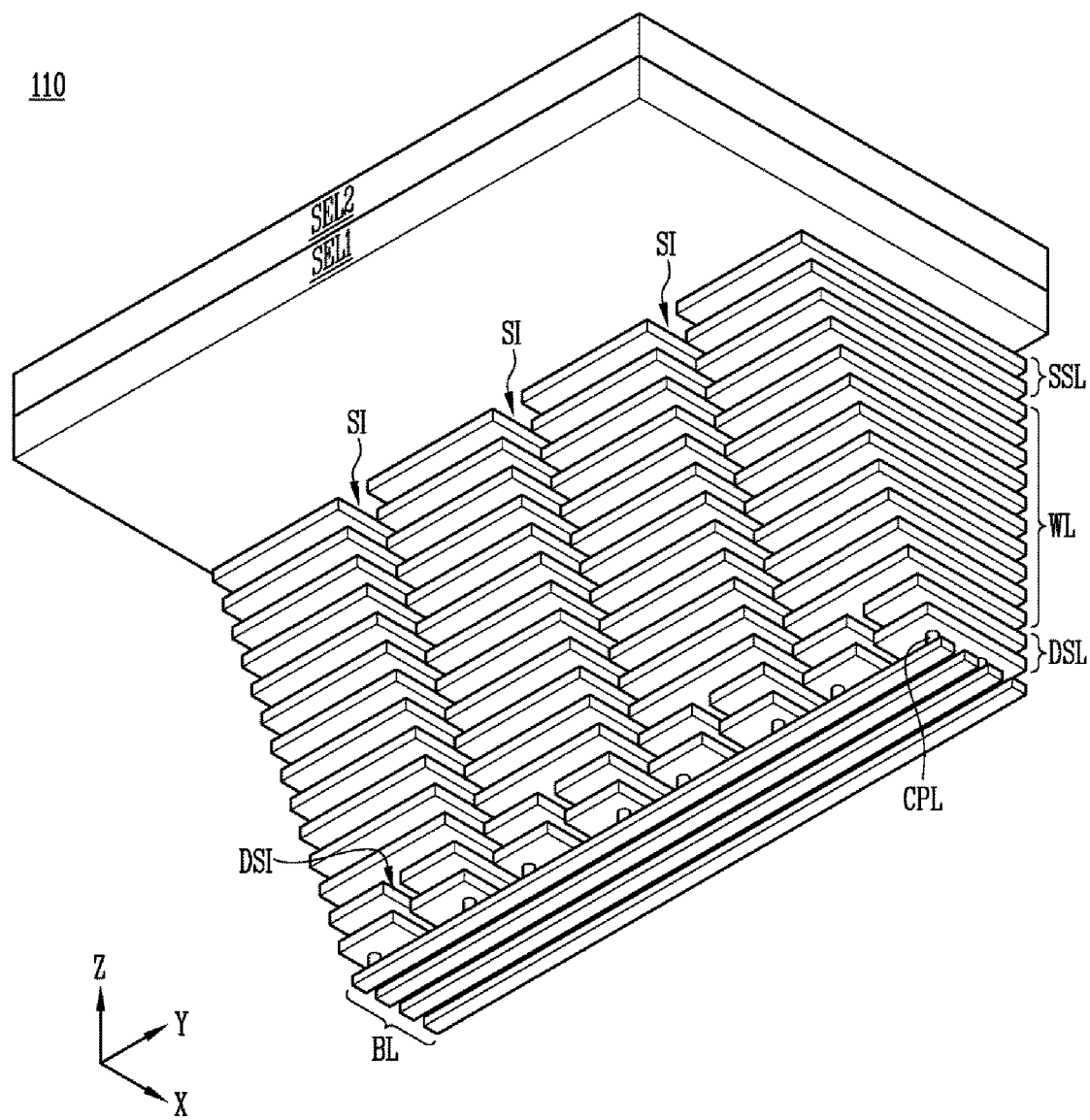
FIG. 3 is a perspective view illustrating an embodiment of the memory cell array, shown in FIG. 2.

FIG. 3 is a perspective view illustrating an embodiment of the memory cell array, shown in FIG. 2.

Referring to FIG. 3, the memory cell array 110 may include a plurality of bit lines BL, a plurality of cell plugs CPL that are connected to the plurality of bit lines BL, a plurality of conductive patterns DSL, SSL, and WL that surrounds the plurality of cell plugs CPL, and a first semiconductor layer SEL1 and a second semiconductor layer SEL2, which are disposed on the plurality of conductive patterns DSL, SSL, and WL.

A memory cell string may be defined along each cell plug CPL. The cell plug CPL may extend in a first direction (e.g., the Z-axis direction).

The plurality of conductive patterns DSL, SSL, and WL may include a plurality of drain select lines DSL, a plurality of word lines WL, and a plurality of source select lines SSL. The plurality of drain select lines DSL may be disposed above the plurality of bit lines BL and may be disposed in at least one layer. The plurality of drain select lines DSL at the same level may be isolated from each other by a plurality of slits SI and a plurality of drain isolation slits DSI. The plurality of word lines WL may be disposed above the plurality of drain select lines DSL and may be disposed in a plurality of layers spaced apart from each other in the first direction (e.g., the Z-axis direction). The plurality of slits SI may extend between adjacent word lines WL at the same level. The plurality of source select lines SSL may be disposed above the plurality of word lines WL and may be disposed in at least one layer. The plurality of slits SI may extend between adjacent source select lines SSL at the same level.

Each drain select line DSL may be used as a gate electrode of a drain select transistor. Each word line WL may be used as a gate electrode of a memory cell. Each source select line SSL may be used as a gate electrode of a source select transistor.

The plurality of conductive patterns DSL, SSL, and WL may extend in a direction intersecting the bit line BL. In an embodiment, the drain select line DSL, the word line WL, and the source select line SSL may extend in an X-axis direction of the XYZ coordinate system, and the bit line BL may extend in a Y-axis direction of the XYZ coordination system.

The first semiconductor layer SEL1 may be disposed on the plurality of source select lines SSL. The second semiconductor layer SEL2 may be disposed on the first semiconductor layer SEL1. Each of the first semiconductor layer SEL1 and the second semiconductor layer SEL2 may extend along an X-Y plane of the XYZ coordinate system.

The first semiconductor layer SEL1 may be used as a source region that provides a current moving path between a channel layer of the cell plug CPL and a discharge circuit of the source line driver 140 during a read operation or a verify operation of a memory cell. The first semiconductor layer SEL1 that is provided as the source region may include a first impurity of a first conductivity type. The first conductivity type may be an n type.

The second semiconductor layer SEL2 may be in contact with a top surface of the first semiconductor layer SEL1. The second semiconductor layer SEL2 may include a well region in direct contact with the first semiconductor layer SEL1.

The second semiconductor layer SEL2 may include a source pickup region and a well pickup region in addition to the well region. The source pickup region and the well pickup region of the second semiconductor layer SEL2 may be doped with impurities of different conductivity types and may be spaced apart from each other on a plane intersecting the cell plug CPL (e.g., an X-Y plane).

Hereinafter, for convenience of description, the embodiment of the present disclosure will be described by providing, as an example, a case in which the above-described first direction is the Z-axis direction, the plane intersecting the cell plug CPL is the X-Y plane, and the extending direction of each of the conductive patterns DSL, WL, and SSL is the X-axis direction.

Figure 4:
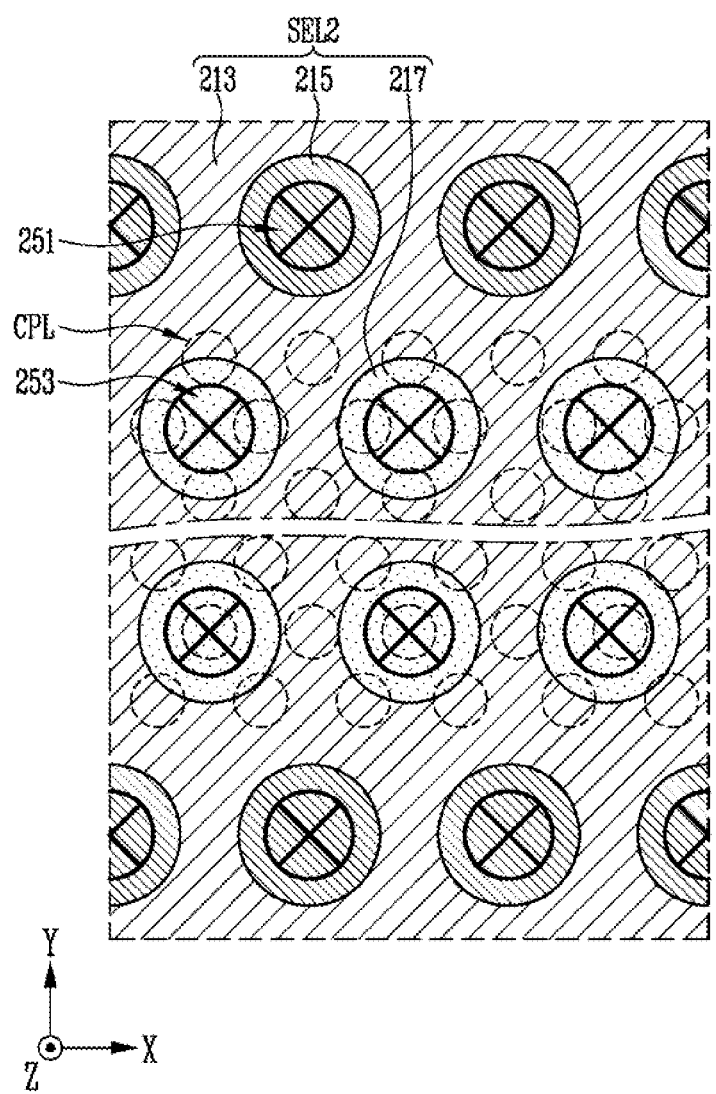
FIG. 4 is a plan view illustrating an embodiment of a second semiconductor layer, shown in FIG. 3.

FIG. 4 is a plan view illustrating an embodiment of the second semiconductor layer, shown in FIG. 3.

Referring to FIG. 4, the second semiconductor layer SEL2 may extend along an X-Y plane to overlap with the plurality of cell plugs CPL. The second semiconductor layer SEL2 may include a well region 213, a well pickup region 215, and a source pickup region 217.

The well region 213 may include a second impurity of a second conductivity type. The second conductivity type may be a p type. The well region 213 may extend along the X-Y plane.

The source pickup region 217 may include a third impurity of a first conductivity type. The concentration of the third impurity in the source pickup region 217 may be higher than that of the first impurity in the first semiconductor layer SEL1, shown in FIG. 3. The source pickup region 217 may be surrounded by the well region 213. The source pickup region 217 may be in contact with a source pickup contact 253. The source pickup contact 253 may extend in the Z-axis direction from the source pickup region 217.

The well pickup region 215 may include a fourth impurity of the second conductivity type. The concentration of the fourth impurity in the well pickup region 215 may be higher than that of the second impurity in the well region 213. The well pickup region 215 may be surrounded by the well region 213. The well pickup region 215 may be in contact with a well pickup contact 251. The well pickup contact 251 may extend in the Z-axis direction from the well pickup region 215.

The arrangement of the source pickup region 217 and the well pickup region 215 in the second semiconductor layer SEL2 may be various. In an embodiment, the second semiconductor layer SEL2 may include a plurality of source pickup regions 217 and a plurality of well pickup regions 215, which are arranged on a plurality of rows. A plurality of source pickup regions 217 on each row may be arranged in a line in the X-axis direction, and a plurality of well pickup regions 215 on each row may be arranged in a line in the X-axis direction. The row that is configured with the source pickup regions 217 and the row that is configured with the well pickup regions 215 may be spaced apart from each other in the Y-axis direction.

On the X-Y plane, each source pickup region 217 and each well pickup region 215 may have various shapes, such as a circular shape, an elliptical shape, and a polygonal shape. Although not shown in the drawing, each source pickup region 217 and each well pickup region 215 may have a line shape on the X-Y plane.

The arrangement of the source pickup contact 253 and the well pickup contact 251 may be various. In an embodiment, one source pickup region 217 may be in contact with one source pickup contact 253, corresponding thereto, and one well pickup region 215 may be in contact with one well pickup contact 251, corresponding thereto.

Figure 5A:
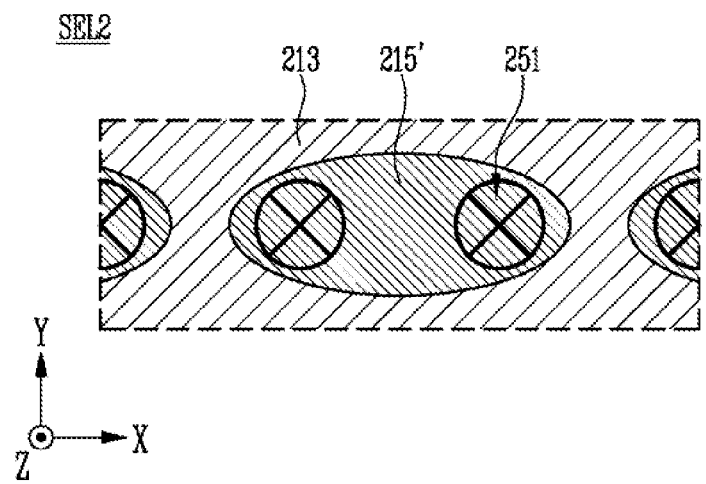
FIGS. 5A and 5B are plan views illustrating a well pickup region and a source pickup region of the second semiconductor layer in accordance with an embodiment of the present disclosure.
Figure 5B:
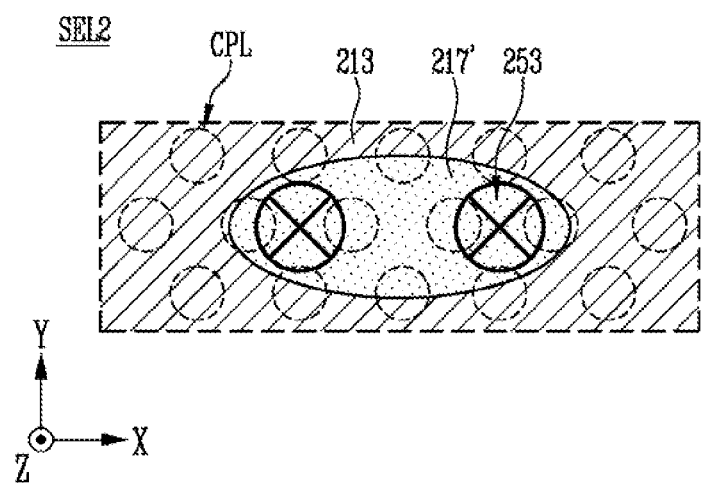

FIGS. 5A and 5B are plan views illustrating a well pickup region and a source pickup region of the second semiconductor layer in accordance with an embodiment of the present disclosure.

Referring to FIGS. 5A and 5B, the second semiconductor layer SEL2 overlapping with the cell plug CPL may include a well region 213 extending on an X-Y plane. Each of a well pickup region 215' and a source pickup region 217' may be surrounded by the well region 213.

Each of the well pickup region 215' and the source pickup region 217' may extend longer in the X-axis direction than the Y-axis direction. In an embodiment, the well pickup region 215' and the source pickup region 217' may have an elliptical shape with a major axis in the X-axis direction on the X-Y plane. Two or more well pickup contacts 251 may be in contact with the well pickup region 215, and two or more source pickup contacts 253 may be in contact with the source pickup region 217'.

Figure 6A:
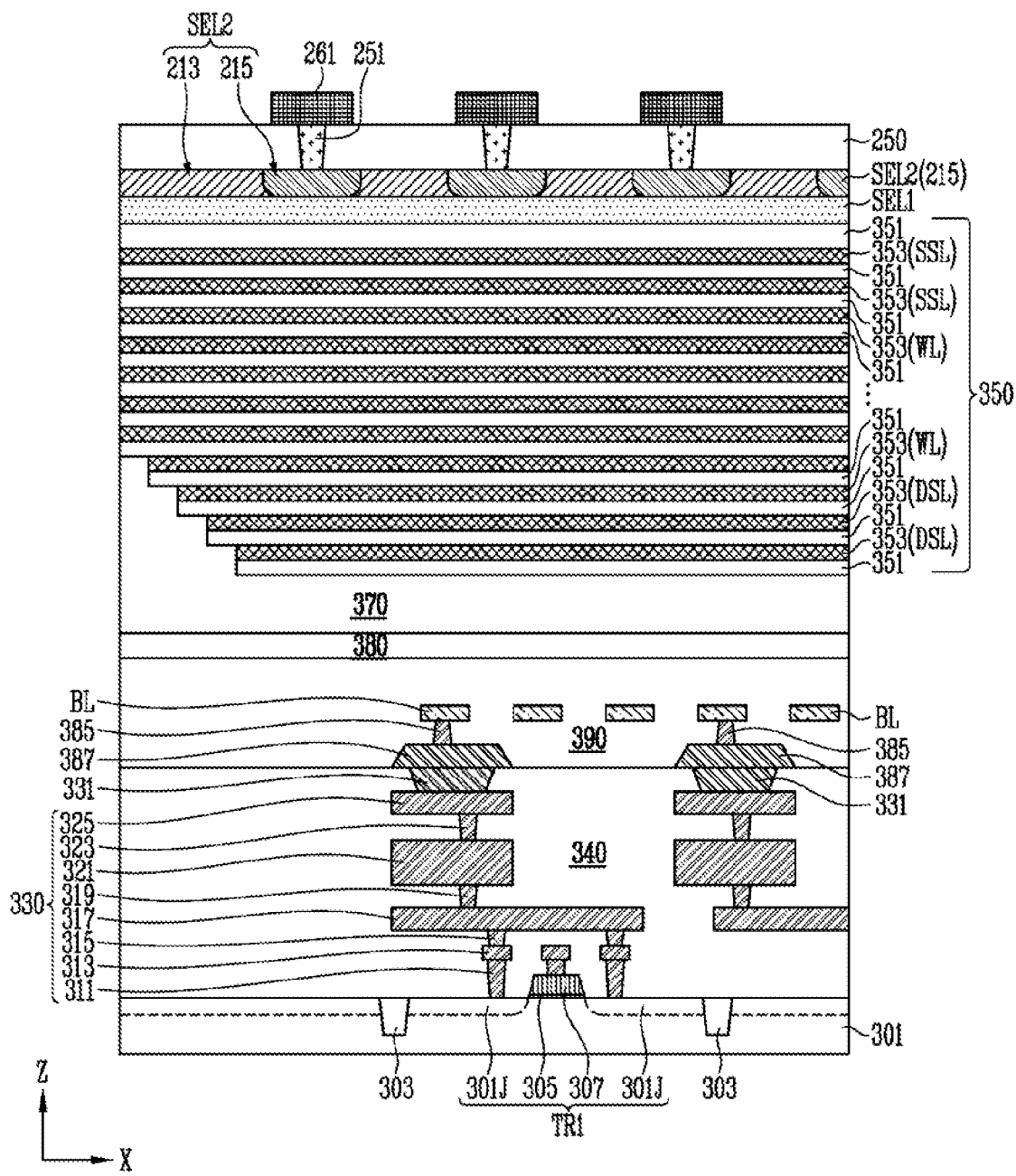
FIGS. 6A and 6B are sectional views illustrating a semiconductor memory device in accordance with an embodiment of the present disclosure.
Figure 6B:
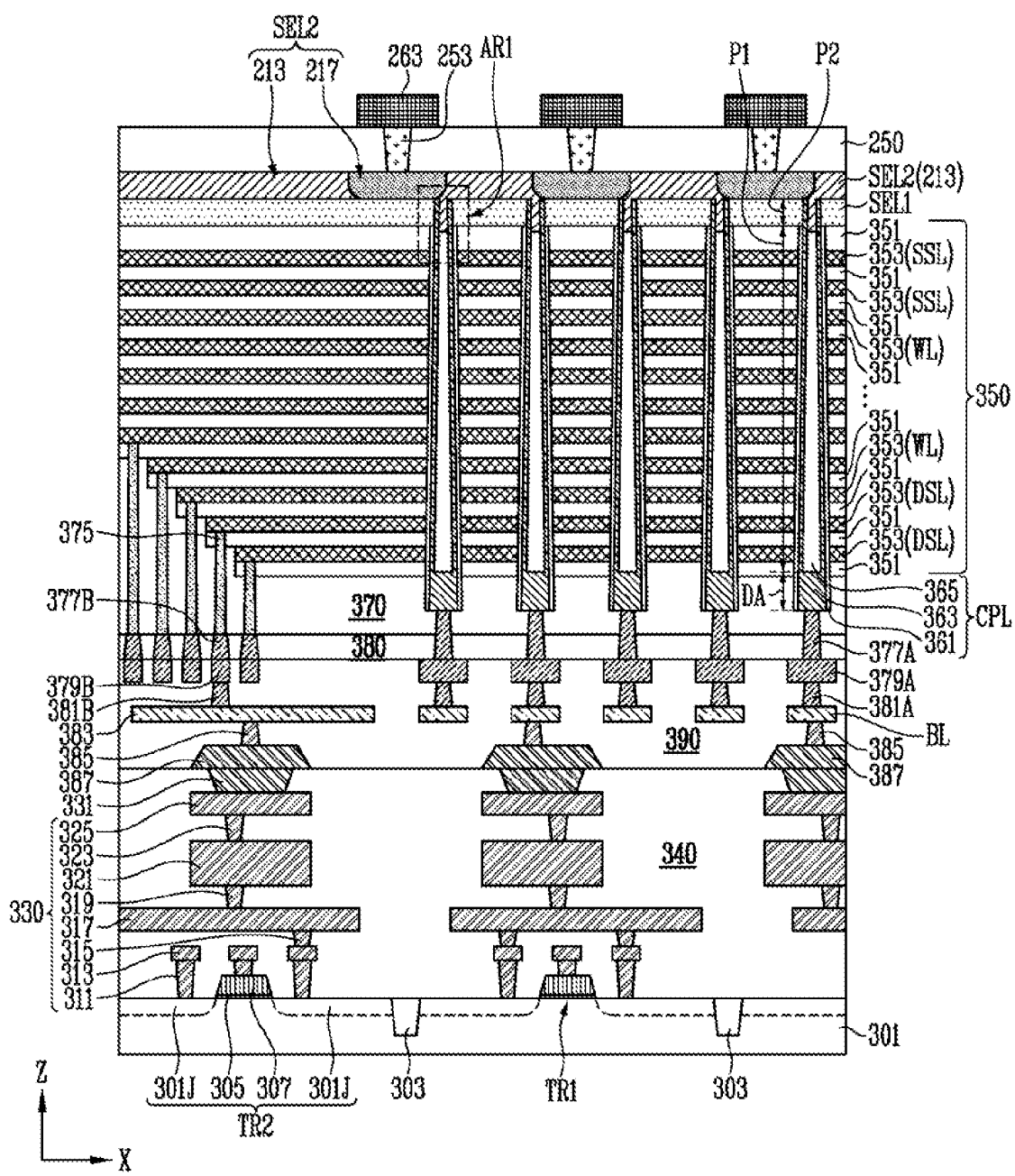

FIGS. 6A and 6B are sectional views illustrating a semiconductor memory device in accordance with an embodiment of the present disclosure. FIGS. 6A and 6B illustrate a plurality of well pickup regions 215 and a plurality of source pickup regions 217, which follow the arrangement described with reference to FIG. 4. FIG. 6A is a sectional view of the semiconductor memory device taken along a plurality of well pickup regions 215 arranged in a line along the X-axis direction, and FIG. 6 is a sectional view of the semiconductor memory device taken along a plurality of source pickup regions 217 arranged in a line along the X-axis direction.

Referring to FIGS. 6A and 6B, a peripheral circuit structure of the semiconductor memory device may include a substrate 301 and a plurality of transistors TR1 and TR2.

The substrate 301 may be a semiconductor substrate including silicon, germanium, etc. The substrate 301 may include active regions that are partitioned by isolation layers 303.

The plurality of transistors TR1 and TR2 may constitute a portion of the peripheral circuit structure 190, shown in FIG. 1. In an embodiment, the plurality of transistors TR1 and TR2 may include a plurality of first transistors TR1 that constitutes the page buffer 160, shown in FIG. 1, and a plurality of second transistors TR2 that constitutes the row decoder 120, shown in FIG. 1.

Each of the first and second transistors TR1 and TR2 may include a gate insulating layer 305, a gate electrode 307, and junctions 301J. The gate insulating layer 305 and the gate electrode 307 may be stacked on the substrate 301 in the active region. The junctions 301J may be provided as a source region and a drain region of a transistor, corresponding thereto. The junctions 301J may be provided by doping any one of an n-type impurity and a p-type impurity into the active regions that are exposed at both sides of the gate electrode 307.

The semiconductor memory device may include a plurality of first interconnections 330 and a plurality of first conductive bonding patterns 331, which are connected to the peripheral circuit structure.

The first interconnections 330 may include a plurality of conductive patterns 311, 313, 315, 317, 319, 321, 323, and 325 that are connected to the plurality of first transistors TR1 and the plurality of second transistors TR2. The plurality of conductive patterns 311, 313, 315, 317, 319, 321, 323, and 325 may be formed in various structures.

Each first conductive bonding pattern 331 may be connected to a first interconnection 330 corresponding thereto.

The first conductive bonding pattern 331 may be connected to a first transistor TR1 or a second transistor TR2, corresponding thereto, via the first interconnection 330.

The substrate 301 may be covered with a first insulating structure 340. The first transistor TR1, the second transistor TR2, the first interconnection 330, and the first conductive bonding pattern 331 may be buried in the first insulating structure 340. The first insulating structure 340 may include two or more insulating layers.

A memory cell array may be disposed on the first insulating structure 340 and the first conductive bonding pattern 331. The memory cell array may include a bit line BL, at least one drain select line DSL, a plurality of word lines WL, at least one source select line SSL, a cell plug CPL, a first semiconductor layer SEL1, and a second semiconductor layer SEL2, which are described with reference to FIG. 3. The at least one drain select line DSL, the plurality of word lines WL, and the at least one source select line SSL may be configured with a plurality of conductive patterns 353 that are stacked to be spaced apart from each other in the Z-axis direction.

The plurality of conductive patterns 353 may be alternately stacked with a plurality of interlayer insulating layers 351, thereby constituting a stack structure 350. The stack structure 350 may overlap with the peripheral circuit structure including the first and second transistors TR1 and TR2. The plurality of conductive patterns 353 might not only be spaced apart from each other in the Z-axis direction, but also may be insulated from each other by the plurality of interlayer insulating layers 351. The plurality of conductive patterns 353 may form a stepped structure. In an embodiment, the plurality of conductive patterns 353 may extend longer in the X-axis direction as becoming more distant from the substrate 301, thereby forming the stepped structure.

The stepped structure of the plurality of conductive patterns 353 may face the first insulating structure 340 and may be covered with a first insulating layer 370. The first insulating layer 370 may be disposed between the stack structure 350 and the first insulating structure 340. The first insulating layer 370 may be penetrated by a plurality of gate vertical contacts 375. The plurality of gate vertical contacts 375 may overlap with the stepped structure of the plurality of conductive patterns 353. The gate vertical contacts 375 may be respectively in contact with the conductive patterns 353 and may extend toward the substrate 301.

The cell plug CPL may penetrate the stack structure 350. The cell plug CPL may include a memory layer 361, a channel layer 363, and a core insulating layer 365.

The channel layer 363 may include a first part P1 and a second part P2 that extends in the Z-axis direction from the first part P1. The first part P1 of the channel layer 363 may be a part that penetrates the stack structure 350. The second part P2 of the channel layer 363 may protrude farther in the Z-axis direction than the stack structure 350. The second part P2 of the channel layer 363 may be surrounded by the first semiconductor layer SEL1. The channel layer 363 may include a drain region DA that extends from the first part P1 toward a direction opposite to that of the second part P2. The drain region DA may be doped with a drain impurity of a first conductivity type. The drain region DA may include a portion that is surrounded by the stack structure 350. The length of the drain region DA that is surrounded by the stack structure 350 may be controlled according to a design rule. The channel layer 363 is a layer that is used as a channel region of a memory cell string, and may include a semiconductor layer. In an embodiment, the channel layer 363 may include silicon.

The semiconductor layer that constitutes the first part P1 and the second part P2 of the channel layer 363 may be formed in a tubular shape. The core insulating layer 365 may be disposed in a central region of the tubular semiconductor layer. The core insulating layer 365 may be disposed between the drain region DA of the channel layer 363 and the second semiconductor layer SEL2.

The memory layer 361 may be disposed between the first part P1 of the channel layer 363 and the stack structure 350.

Figure 7:
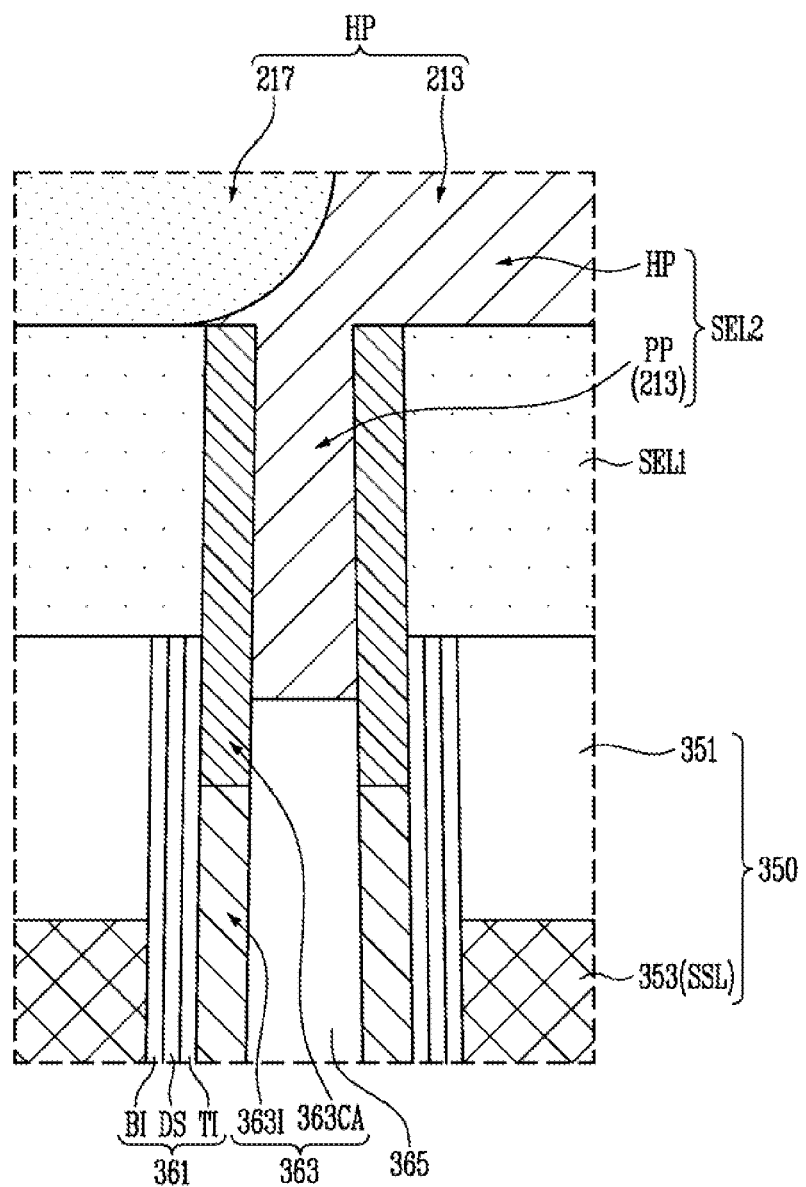
FIG. 7 is an enlarged sectional view illustrating region AR1, shown in FIG. 6B.

FIG. 7 is an enlarged sectional view illustrating region AR1, shown in FIG. 6B.

Referring to FIG. 7, the memory layer 361 may include a blocking insulating layer BI between the channel layer 363 and the stack structure 350, a data storage layer DS between the blocking insulating layer BI and the channel layer 363, and a tunnel insulating layer TI between the data storage layer DS and the channel layer 363. The data storage layer DS may be configured as a material layer that is capable of storing data that is changed through Fowler-Nordheim tunneling. The material layer may include a nitride layer in which charges can be trapped. The tunnel insulating layer TI may include an insulating material through which charges can tunnel. In an embodiment, the tunnel insulating layer TI may include a silicon oxide layer.

Referring to FIGS. 6A and 6B, memory cells may be formed at intersection portions of the channel layer 363 of the cell plug CPL and the plurality of word lines WL. The memory cells may form a three-dimensional memory cell array. A drain select transistor may be formed at an intersection portion of the channel layer 363 of the cell plug CPL and the drain select line DSL. A source select transistor may be formed at an intersection portion of the channel layer 363 of the cell plug CPL and the source select line SSL. At least one drain select transistors, a plurality of memory cells, and at least one source select transistor may be connected in series by the channel layer 363.

The cell plug CPL may extend into the first insulating layer 370. The drain region DA of the channel layer 363 may include a portion that is surrounded by the first insulating layer 370. The memory layer 361 may extend between the drain region DA of the channel layer 363 and the first insulating layer 370.

The plurality of gate vertical contacts 375 and the first insulating layer 370 may be covered with a second insulating layer 380 between the first insulating layer 370 and the first insulating structure 340.

The bit line BL may be disposed between the stack structure 350 and the peripheral circuit structure with the first and second transistors TR1 and TR2. A metal line 383 may be disposed at a level that is substantially equal to that of the bit line BL. The bit line BL and the metal line 383 may be spaced apart from each other and may include various conductive materials. The bit line BL and the metal line 383 may be buried in a second insulating structure 390 between the second insulating layer 380 and the first insulating structure 340.

The second insulating structure 390 may extend between the second insulating layer 380 and the level at which the metal line 383 and the bit line BL are disposed and may extend between the first insulating structure 340 and the level at which the metal line 383 and the bit line BL are disposed. The second insulating structure 390 may insulate between the bit line BL and the metal line BL. The second insulating structure 390 may include two or more insulating layers that are stacked between the first insulating structure 340 and the second insulating layer 380.

The bit line BL may be connected to the channel layer 363 via a channel-bit connection structure that is configured with conductive patterns with various structures. In an embodiment, a first channel-bit connection structure 377A, a second channel-bit connection structure 379A, and a third channel-bit connection structure 381A may be disposed between the bit line BL and the stack structure 350. The first channel-bit connection structure 377A may extend to penetrate the first insulating layer 370 and the second insulating layer 380 from the drain region DA of the channel layer 363. The second channel-bit connection structure 379A and the third channel-bit connection structure 381A may be buried in the second insulating structure 390 between the first channel-bit connection structure 377A and the bit line BL.

The gate vertical contact 375 may be connected to the metal line 383 via a gate-line connection structure configured with conductive patterns with various structures. In an embodiment, a first gate-line connection structure 377B, a second gate-line connection structure 379B, and a third gate-line connection structure 381B may be disposed between the gate vertical contact 375 and the metal line 383. The first gate-line connection structure 377B may extend to penetrate the second insulating layer 380 from the gate vertical contact 375. The second gate-line connection structure 379B and the third gate-line connection structure 381B may be buried in the second insulating structure 390 between the first gate-line connection structure 377B and the metal line 383.

The bit line BL and the metal line 383 may be connected to the plurality of first conductive bonding patterns 331 via a plurality of second interconnections 385 and a plurality of second conductive bonding patterns 387, which are configured with conductive patterns with various structures. The plurality of second interconnections 385 and the plurality of second conductive bonding patterns 387 may be buried in the second insulating structure 390 between the first insulating structure 340 and the level at which the bit line BL and the metal line 383 are disposed.

Each second conductive bonding pattern 387 may be bonded to a first conductive bonding pattern 331, corresponding thereto. Each of the bit line BL and the metal line 383 may be connected to a second conductive bonding pattern 387, corresponding thereto, via a second interconnection 385, corresponding thereto.

According to the above-described structure, the first transistor TR1 may be connected to the channel layer 363 of the cell plug CPL via the first interconnection 330, the first conductive bonding pad 331, the second conductive bonding pattern 387, the second interconnection 385, the bit line BL, and the channel-bit connection structures 377A, 379A, and 381A. The second transistor TR2 may be connected to the conductive pattern 353 of the stack structure 350 via the first interconnection 330, the first conductive bonding pattern 331, a second conductive bonding pattern 387, the second interconnection 385, the metal line 383, the gate-line connection structures 377B, 379B, and 381B, and the gate vertical contact 375.

The first semiconductor layer SEL1 may be disposed on the stack structure 350. The first semiconductor layer SEL1 may surround the second part P2 of the channel layer 363 and may be in direct contact with the second part P2 of the channel layer 363.

The second semiconductor layer SEL2 may cover the first semiconductor layer SEL1 and the channel layer 363 of the cell plug CPL. The well region 213 of the second semiconductor layer SEL2 may be in direct contact with the tubular semiconductor layer that constitutes the channel layer 363. In an embodiment, the second semiconductor layer SEL2 may be in direct contact with an inner wall of the tubular semiconductor layer. To this end, the second semiconductor layer SEL2 may extend to a central region of the cell plug CPL.

Each of the well pickup contact 251 and the source pickup contact 253 may be configured with various conductive materials. Each of the well pickup contact 251 and the source pickup contact 253 may penetrate an upper insulating layer 250 on the second semiconductor layer SEL2. The well pickup contact 251 may connect the well pickup region 215 of the second semiconductor layer SEL2 to a first upper line 261. The source pickup contact 253 may connect the source pickup region 217 of the second semiconductor layer SEL2 to a second upper line 263.

The first upper line 261 may be connected to the well region 213 of the second semiconductor layer SEL2 via the well pickup contact 251. The first upper line 261 may transmit an erase voltage during an erase operation. The well region 213 of the second semiconductor layer SEL2 may include a second impurity of a second conductivity type and may be in contact with the channel layer 363. The second conductivity type may be a p type. Accordingly, holes as majority carriers of the well region 213 may be supplied to the channel layer 363 during an erase operation.

The second upper line 263 may be connected to the first semiconductor layer SEL1 as a source region via the source pickup contact 253. The first semiconductor layer SEL1 may include a first impurity of a first conductivity type and may be in contact with the channel layer 363. The first conductivity type may be an n type. The second upper line 263 may transmit a source voltage that is discharged during a read operation or a verify operation. During the read operation or the verify operation, a read voltage or a verify voltage may be applied to a selected word line that is connected to a selected memory cell, and a source voltage for discharge (e.g., a ground voltage) may be applied to the first semiconductor layer SEL1. Accordingly, when a threshold voltage of the selected memory cell is lower than the read voltage or the verify voltage, which is applied to the selected word line, a voltage precharged to the bit line BL may be discharged through the first semiconductor layer SEL1 via the channel layer 363 during the read operation or the verify operation.

As shown in FIG. 7, the second semiconductor layer SEL2 may include a horizontal part HP that is parallel to the top surface of the first semiconductor layer SEL1 and a protrusion part PP that protrudes toward the core insulating layer 365 from the horizontal part HP.

The protrusion part PP of the second semiconductor layer SEL2 may be disposed in the central region of the tubular semiconductor layer, to be in direct contact with the inner wall of the tubular semiconductor layer, constituting the channel layer 363. A portion of the well region 213 may include the protrusion part PP of the second semiconductor layer SEL2.

Another portion of the well region 213, the source pickup region 217, and the well pickup region 215, shown in FIGS. 6A and 6B, may include the horizontal part HP of the second semiconductor layer SEL2.

The channel layer 363 may include a channel impurity region 363CA and an intrinsic region 363I in a substantially intrinsic state. The intrinsic region 363I may be defined between the drain region DA, shown in FIG. 6B, and the channel impurity region 363CA. In an embodiment, the intrinsic region 363I may be configured with an undoped silicon layer. The channel impurity region 363CA may include a partial region of the channel layer 363 in contact with the first semiconductor layer SEL1. The channel impurity region 363CA may extend toward the level at which a conductive pattern 353 that is adjacent to the first semiconductor layer SEL1 is disposed from the level at which the first semiconductor layer SEL1 is disposed. The channel impurity region 363CA may include a channel impurity of a second conductivity type. The concentration of the channel impurity in the channel impurity region 363CA may be relatively higher in a region that is close to the second semiconductor layer SEL2 than a region that is closer to the intrinsic region 363I.

In accordance with an embodiment of the present disclosure, the first semiconductor layer SEL1 and each source pickup region 217 of the second semiconductor layer SEL2 may include an impurity of a first conductivity type, and the channel impurity region 363CA of the channel layer 363, the well region 213 of the second semiconductor layer SEL2, and the well pickup region 215 of the second semiconductor layer SEL2, which is shown in FIG. 6A, may include an impurity of a second conductivity type. The first conductivity type and the second conductivity type may be different types. The first conductivity type may be an n type, and the second conductivity type may be a p type.

In accordance with an embodiment of the present disclosure, the channel layer 363 may be in direct contact with the first semiconductor layer SEL1 and each well region 213 of the second semiconductor layer SEL2, which are doped with impurities of different conductivity types. When a high voltage is applied to the channel layer 363 and a discharge voltage is applied to the first semiconductor layer SEL1 of the first conductivity type, a discharge path between the channel layer 363 and the first semiconductor layer SEL1 may be formed. In addition, when a high voltage is applied to the well region 213 of the second semiconductor layer SEL2, holes from the second semiconductor layer SEL2 may be supplied to the channel layer 363.

Hereinafter, a method of manufacturing the semiconductor memory device, shown in FIGS. 6A and 6B, will be described for each process. Hereinafter, overlapping descriptions of the same components will be omitted.

Figure 8A:
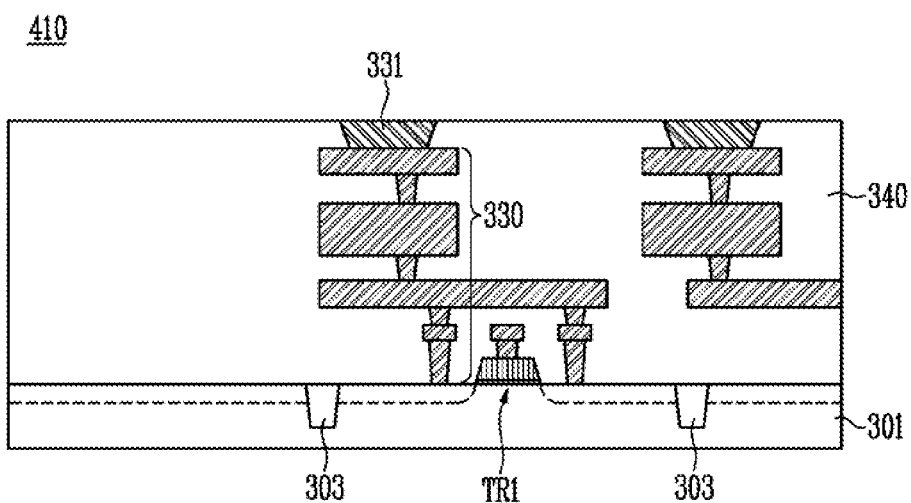
FIGS. 8A and 8B are sectional views illustrating a process of forming a circuit structure in accordance with an embodiment of the present disclosure.
Figure 8B:
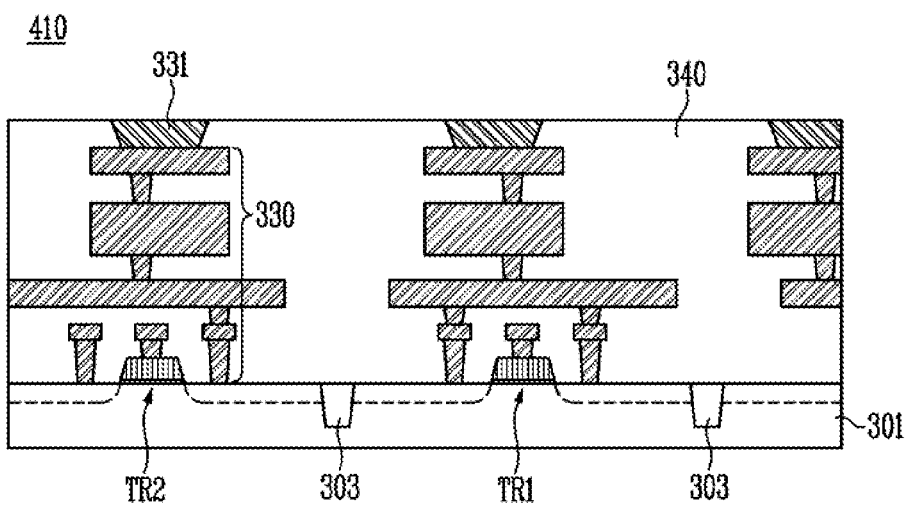

FIGS. 8A and 8B are sectional views illustrating a process of forming a circuit structure in accordance with an embodiment of the present disclosure. FIGS. 8A and 8B are sectional views illustrating regions corresponding to FIGS. 6A and 6B.

Referring to FIGS. 8A and 8B, a circuit structure 410 of a semiconductor memory device may be formed.

The process of forming the circuit structure 410 may include a process of forming a peripheral circuit structure with a first transistor TR1 and a second transistor TR2. The first transistor TR1 and the second transistor TR2 may be formed in active regions of a substrate 301, which are partitioned by isolation layers 303. The first transistor TR1 and the second transistor TR2 may be configured identically to those described with reference to FIGS. 6A and 6B.

The process of forming the circuit structure 410 may include a process of forming a plurality of first interconnections 330 and a plurality of first conductive bonding patterns 331, which are buried in a first insulating structure 340. The plurality of first interconnections 330 and the plurality of first conductive bonding patterns 331 may be configured identically to those described with reference to FIGS. 6A and 6B.

Figure 9A:
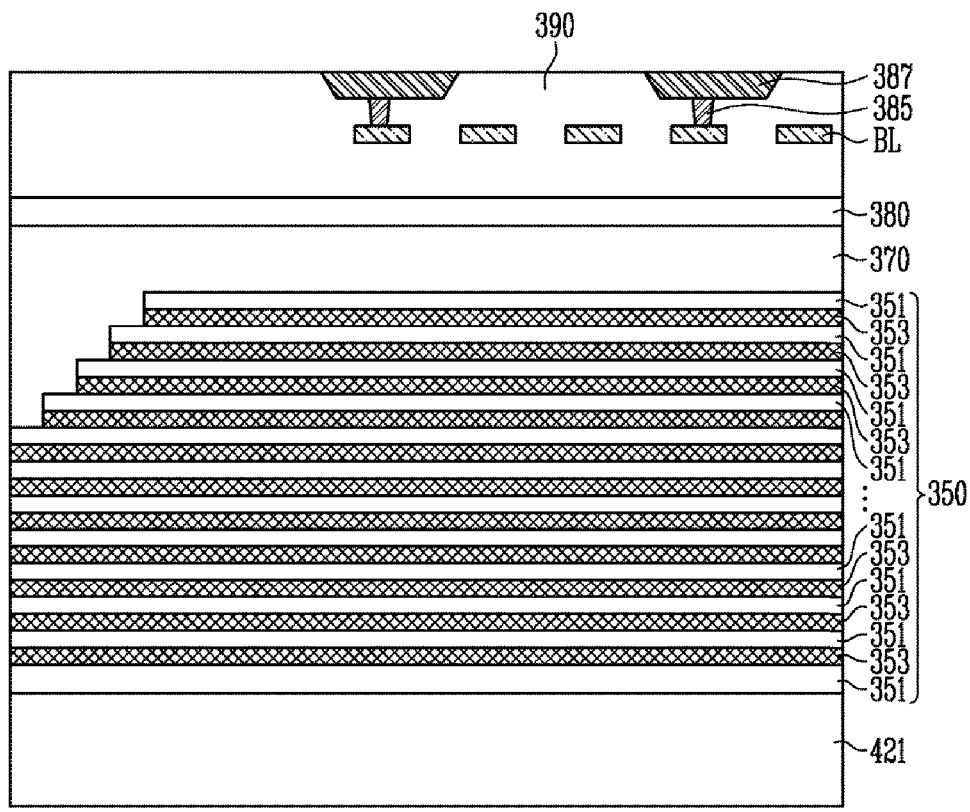
FIGS. 9A and 9B are sectional views illustrating a method of forming a preliminary memory array in accordance with an embodiment of the present disclosure.
Figure 9B:
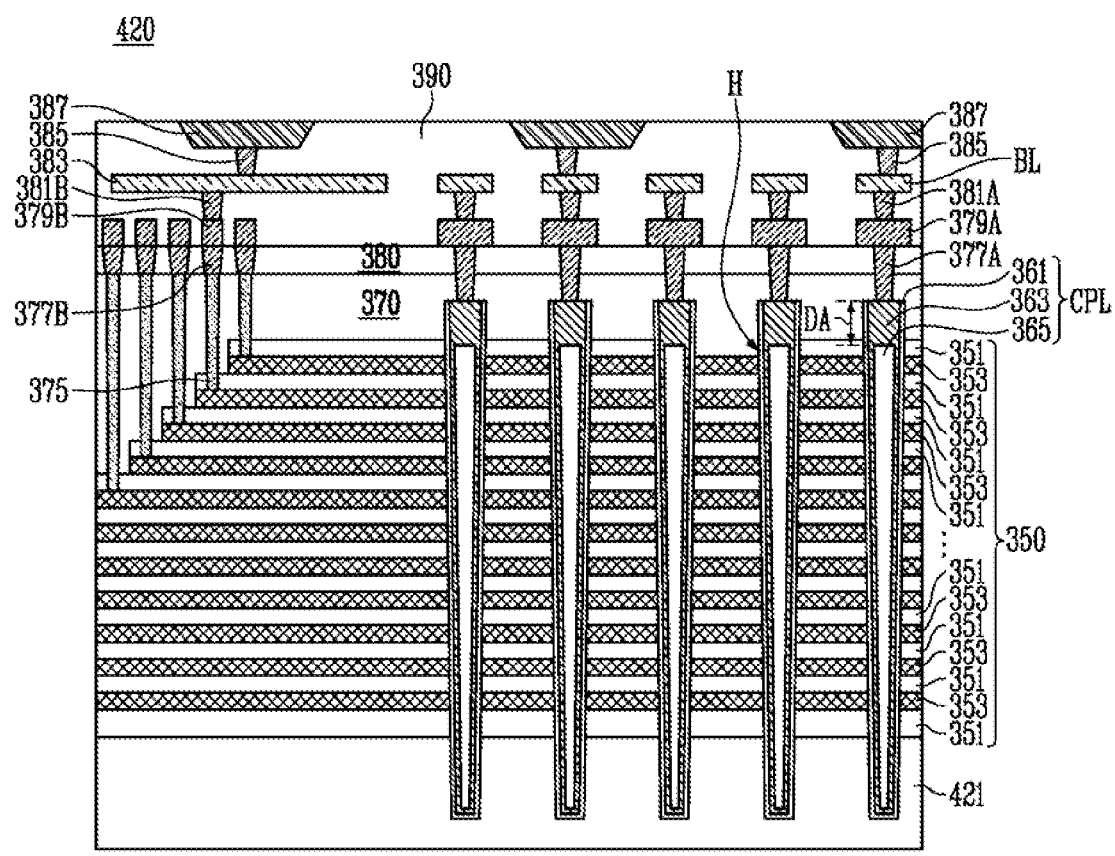

FIGS. 9A and 9B are sectional views illustrating a method of forming a preliminary memory array in accordance with an embodiment of the present disclosure. FIGS. 9A and 9B are sectional views illustrating regions corresponding to FIGS. 6A and 6B.

Referring to FIGS. 9A and 9B, a preliminary memory array 420 may be formed on a sacrificial substrate 421. The sacrificial substrate 421 may be a silicon layer.

The preliminary memory array 420 may include a three-dimensional memory cell array, a plurality of gate vertical contacts 375, a first channel-bit connection structure 377A, a second channel-bit connection structure 379A, a third channel-bit connection structure 381A, a first gate-line connection structure 377B, a second gate-line connection structure 379B, a third gate-line connection structure 381B, a metal line 383, a bit line BL, a plurality of second interconnections 385, and a plurality of second conductive bonding patterns 387.

The three-dimensional memory cell array may include a stack structure 350 that is disposed on the sacrificial substrate 421 and a cell plug CPL that penetrates the stack structure 350 and extend to the inside of the sacrificial substrate 421. The stack structure 350 may include interlayer insulating layers 351 and conductive patterns 353, which are alternately disposed on the sacrificial substrate 421.

The cell plug CPL may be formed in a channel hole H. The channel hole H may penetrate the interlayer insulating layers 351 and the conductive patterns 353 and may extend into the sacrificial substrate 421. The cell plug CPL may include a memory layer 361 that extends along a surface of the channel hole H and a channel layer 363 disposed on the memory layer 361. The cell plug CPL may include a core insulating layer 365 that fills a central region of the channel hole H. The channel layer 363 may extend along a sidewall, a bottom surface, and a top surface of the core insulating layer 365, to surround the core insulating layer 365. The channel layer 363 may include a drain region DA including an n-type impurity. The drain region DA may cover a top end of the core insulating layer 365. The top end of the core insulating layer 365 may be defined as an end portion of the core insulating layer 365, which faces a direction opposite to that facing the sacrificial substrate 421.

The cell plug CPL and the stack structure 350 may be covered by a first insulating layer 370. The first insulating layer 370 may be penetrated by a plurality of gate vertical contacts 375.

A second insulating layer 380 may be formed on the first insulating layer 370. The first channel-bit connection structure 377A and the first gate-line connection structure 377B may be formed to penetrate the second insulating layer 380. The first channel-bit connection structure 377A may extend toward the drain region DA of the channel layer 363. The first gate-line connection structure 377B may be connected to a gate vertical contact 375, corresponding thereto. The first channel-bit connection structure 377A and the first gate-line connection structure 377B may be formed through one mask process and may be formed of the same conductive material.

The second channel-bit connection structure 379A and the second gate-line connection structure 379B may be formed through one mask process and may be formed of the same conductive material. The third channel-bit connection structure 381A and the third gate-line connection structure 381B may be formed through one mask process and may be formed of the same conductive material. The bit line BL and the metal line 383 may be formed through one mask process and may be formed of the same conductive material. After the bit line BL and the metal line 383 are formed, the plurality of second interconnections 385 and the plurality of second conductive bonding patterns 387 may be sequentially formed. Two or more insulating layers of a second insulating structure 390 may be deposited before or after each of the process of forming the second channel-bit connection structure 379A and the second gate-line connection structure 379B, the process of forming the third channel-bit connection structure 381A and the third gate-line connection structure 381B, the process of forming the bit line BL and the metal line 383, and the process of forming the plurality of second interconnections 385 and the plurality of second conductive bonding patterns 387.

Figure 10A:
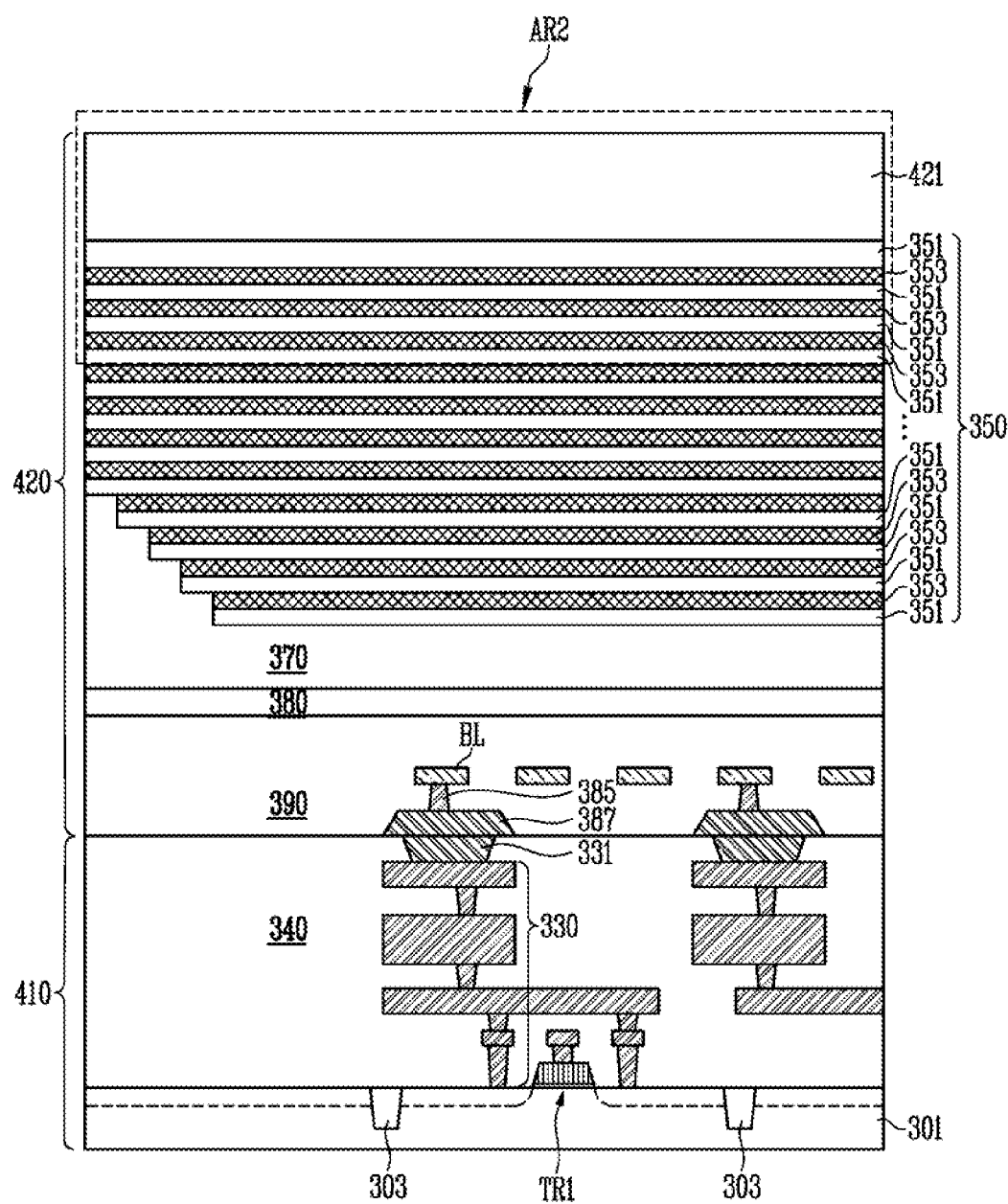
FIGS. 10A and 10B are sectional views illustrating a bonding process.
Figure 10B:
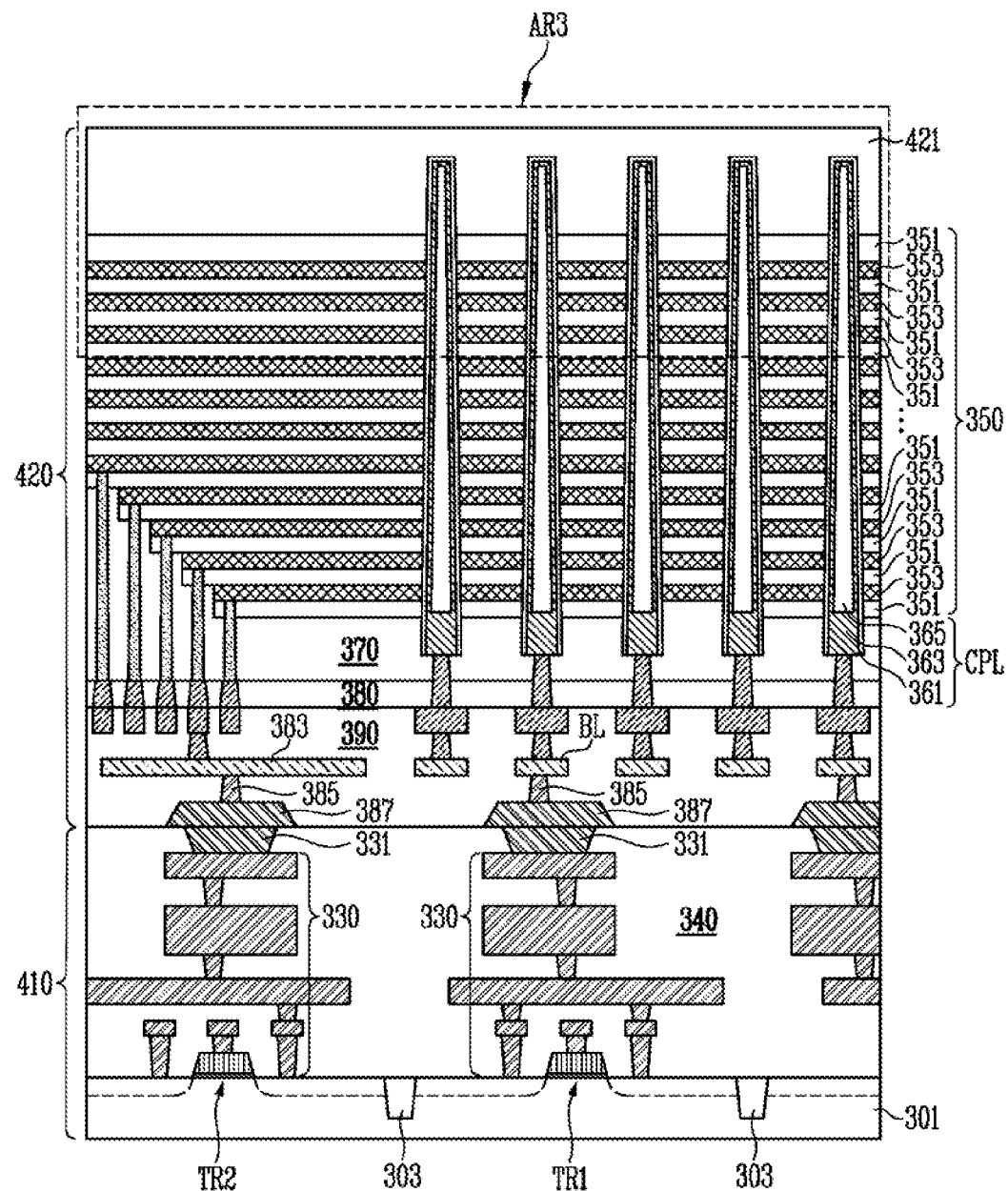

FIGS. 10A and 10B are sectional views illustrating a bonding process. FIGS. 10A and 10B are sectional views illustrating regions corresponding to FIGS. 6A and 6B.

Referring to FIGS. 10A and 10B, the circuit structure 410 and the preliminary memory array 420 may be aligned such that the second insulating structure 390 of the preliminary memory array 420 face the first insulating structure 340 of the circuit structure 410. Subsequently, the preliminary memory array 420 may be connected to the circuit structure 410. In an embodiment, the second conductive bonding pattern 387 of the preliminary memory array 420 may be bonded to the first conductive bonding pattern 331 of the circuit structure 410, so that the preliminary memory array 420 can be connected to the circuit structure 410.

Figure 11A:
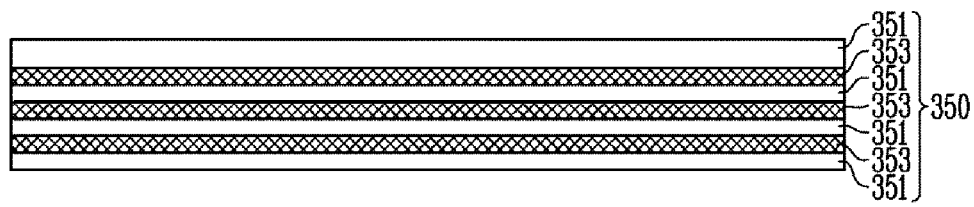
FIGS. 11A and 11B are sectional views illustrating subsequent processes for region AR2, shown in FIG. 10A, and region AR3, shown in FIG. 10B.
Figure 11B:
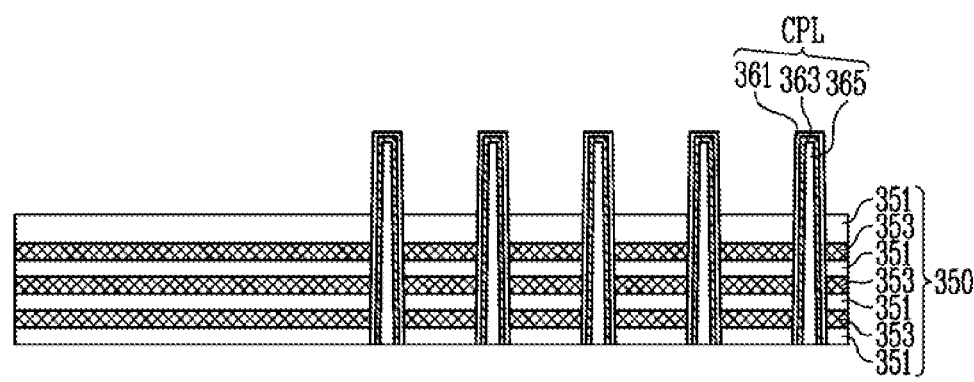

FIGS. 11A and 11B are sectional views illustrating subsequent processes for region AR2, shown in FIG. 10A, and region AR3, shown in FIG. 10B.

Referring to FIGS. 11A and 11B, the sacrificial substrate 421, shown in FIGS. 10A and 10B, may be removed. Accordingly, the interlayer insulating layer 351 of the stack structure 350 and the memory layer 361 of the cell plug CPL may be exposed.

Figure 12:
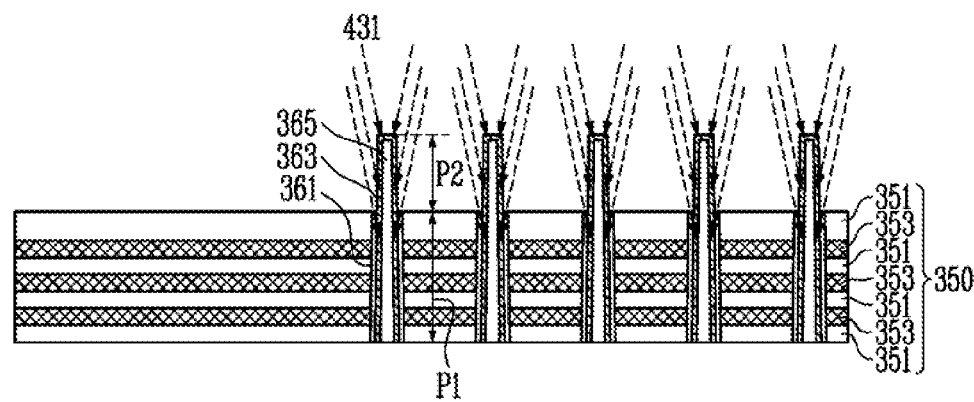
FIGS. 12 to 14 are sectional views illustrating an embodiment of subsequent processes performed on the region AR3, shown in FIG. 10B, after the process, shown in FIG. 11.
Figure 13:
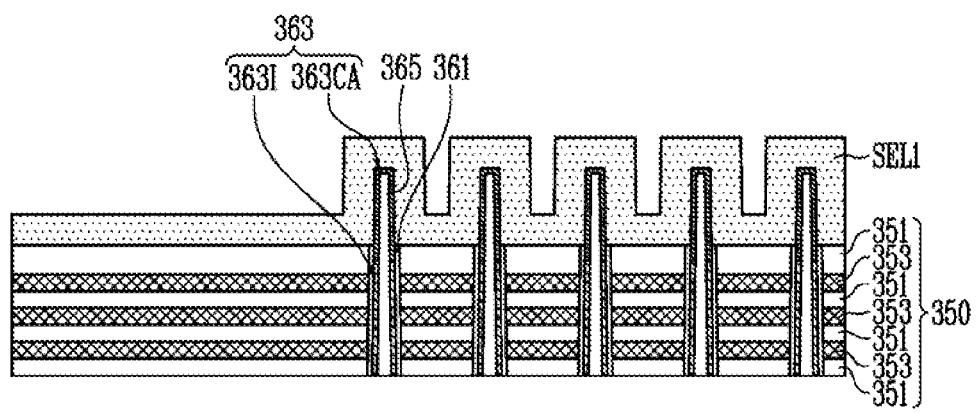
Figure 14:
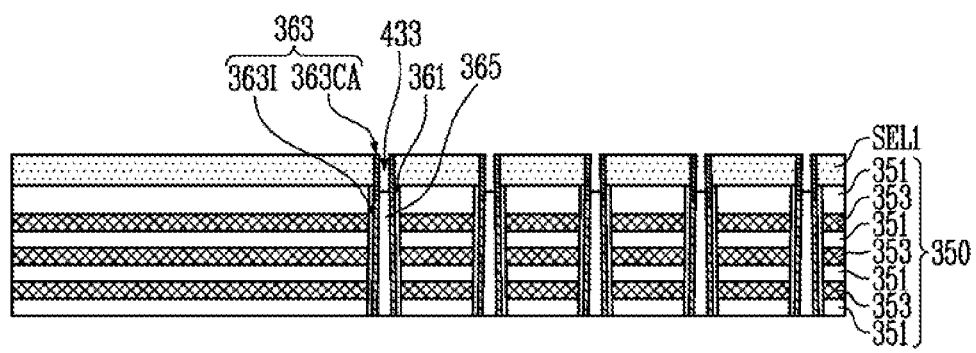

FIGS. 12 to 14 are sectional views illustrating an embodiment of subsequent processes performed on the region AR3, shown in FIG. 10B, after the process, shown in FIG. 11.

Referring to FIG. 12, a portion of the memory layer 361 may be removed such that a portion of the channel layer 363 is exposed. Accordingly, the channel layer 363 may be divided into a first part P1 and a second part P2. The first part P1 of the channel layer 363 may be surrounded by the stack structure 350 with the remaining memory layer 361 that is interposed therebetween. The second part P2 of the channel layer 363 may be exposed in a state in which the second part P2 protrudes farther than the stack structure 350.

Subsequently, a channel impurity 431 of a second conductivity type may be implanted into the exposed second part P2 of the channel layer 363. The second conductivity type may be a P type as described above.

Referring to FIG. 13, a channel impurity region 363CA may be defined at the second part P2 of the channel layer 363, shown in FIG. 12, through the process, shown in FIG. 12. The channel impurity region 363CA may extend between a portion of the stack structure 350 and the memory layer 361. A partial region of the channel layer 363 may remain as an intrinsic region 363I.

Subsequently, a first semiconductor layer SEL1 may be formed along a step difference that is defined by the partial region of the channel layer 363, which protrudes farther than the stack structure 350. The first semiconductor layer SEL1 may include a first impurity of a first conductivity type. The first conductivity type may be an n type as described above.

In an embodiment, the process of forming the first semiconductor layer SEL1 may include a process of forming a poly-silicon layer along the step difference that is defined by the partial region of the channel layer 363, which protrudes farther than the stack structure 350, and a process of implanting the first impurity of the first conductivity type into the poly-silicon layer. The process of forming the first semiconductor layer SEL1 may further include a laser annealing process for activating the first impurity of the first conductivity type.

Referring to FIG. 14, the first semiconductor layer SEL1 and the channel layer 363 may be planarized, thereby exposing the core insulating layer 365. The planarization may be performed through a Chemical Mechanical Polishing (CMP) process. The first semiconductor layer SEL1 may remain to surround the channel impurity region 363CA of the channel layer 363 and may remain in a state in which the first semiconductor layer SEL1 is in direct contact with the channel impurity region 363CA.

Subsequently, a portion of the core insulating layer 365 may be removed, thereby defining a recess region 433. The recess region 433 may correspond to a portion of the central region of the channel hole H, shown in FIG. 9B. The recess region 433 may be surrounded by the channel impurity region 363CA of the channel layer 363.

Figure 15A:
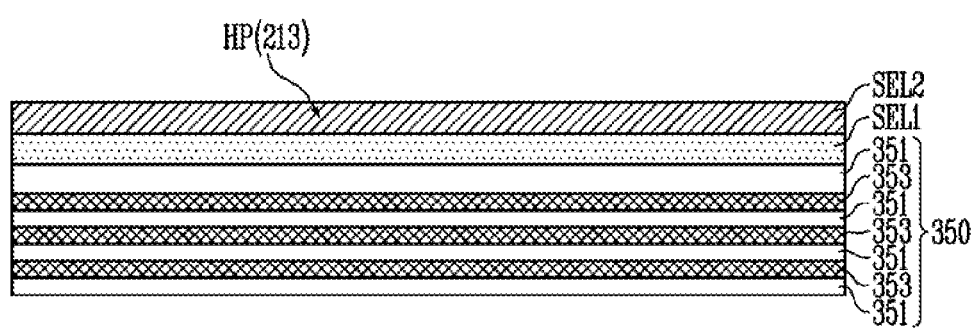
FIGS. 15A and 15B are sectional views illustrating an embodiment of subsequent processes performed on the region AR2, shown in FIG. 10A, and the region AR3, shown in FIG. 10B, after the process, shown in FIG. 14.
Figure 15B:
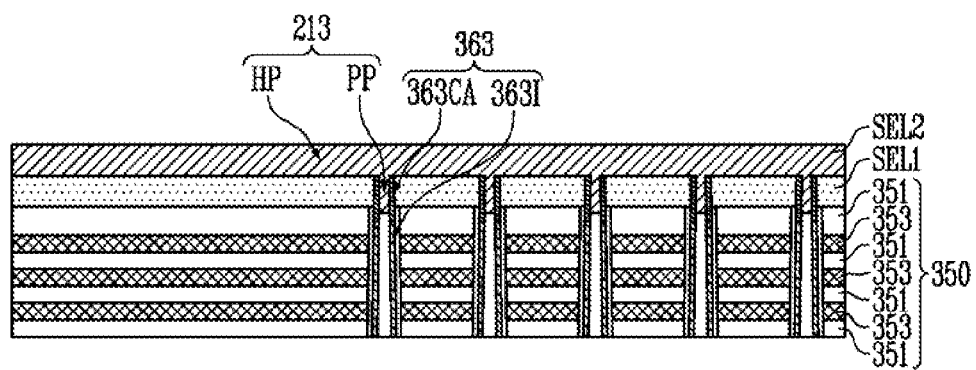

FIGS. 15A and 15B are sectional views illustrating an embodiment of subsequent processes performed on the region AR2, shown in FIG. 10A, and the region AR3, shown in FIG. 10B, after the process, shown in FIG. 14.

Referring to FIGS. 15A and 15B, a second semiconductor layer SEL2 with a well region 213 may be formed on the first semiconductor layer SEL1. The well region 213 may include a second impurity of a second conductivity type. The well region 213 may be in direct contact with the first semiconductor layer SEL1 and the channel layer 363.

In an embodiment, the process of forming the second semiconductor layer SEL2 with the well region 213 may include a process of forming a poly-silicon layer on the first semiconductor layer SEL1 and a process of implanting the second impurity of the second conductivity type into the poly-silicon layer. The process of forming the second semiconductor layer SEL2 may further include a laser annealing process for activating the second impurity of the second conductivity type. The second impurity of the second conductivity type may be a P-type impurity for the well region 213.

The second semiconductor layer SEL2 may include a horizontal part HP that is parallel to a top surface of the first semiconductor layer SEL1 and a protrusion part PP that extends to fill the recess region 433, shown in FIG. 14, from the horizontal part HP.

Figure 16:
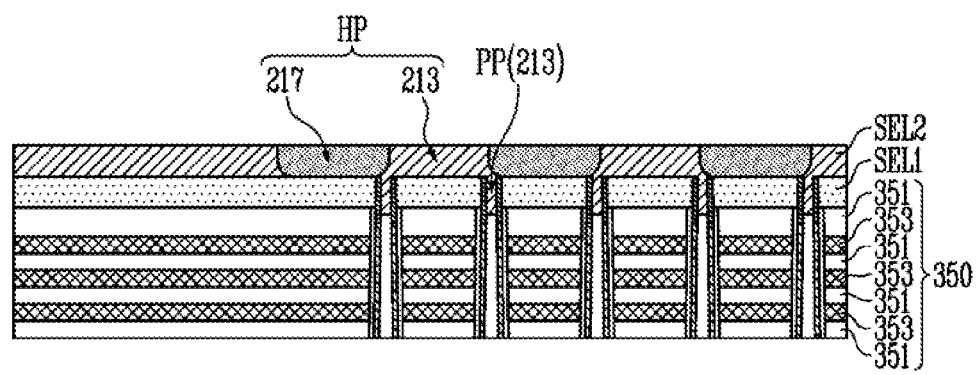
FIG. 16 is a sectional view illustrating an embodiment of a subsequent process performed on the region AR3, shown in FIG. 10B, after the process, shown in FIG. 15B.
Figure 17:
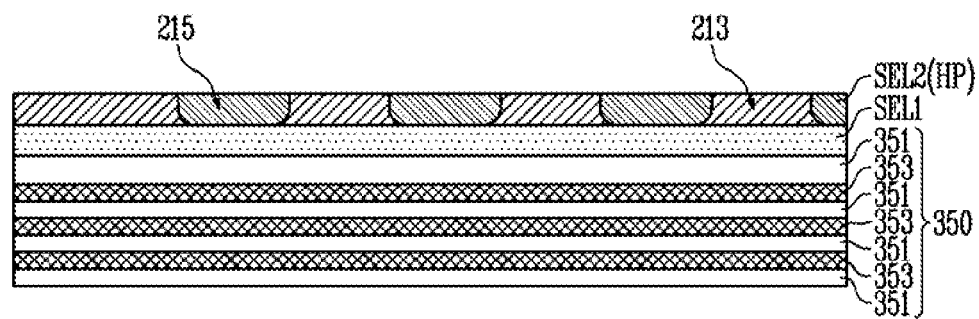
FIG. 17 is a sectional view illustrating an embodiment of a subsequent process performed on the region AR2, shown in FIG. 10A, after the process, shown in FIG. 15A.

FIG. 16 is a sectional view illustrating an embodiment of a subsequent process performed on the region AR3, shown in FIG. 10B, after the process, shown in FIG. 15B, and FIG. 17 is a sectional view illustrating an embodiment of a subsequent process performed on the region AR2, shown in FIG. 10A, after the process, shown in FIG. 15A.

The process, shown in FIG. 16, and the process, shown in FIG. 17, may be individually performed. The process, shown in FIG. 17, may be performed after the process, shown in FIG. 16, is performed, or the process, shown in FIG. 16, may be performed after the process, shown in FIG. 17, is performed.

Referring to FIG. 16, a third impurity of the first conductivity type may be implanted with a concentration that is higher than that of the first impurity in the first semiconductor layer SEL1 such that a source pickup region 217 is defined in the horizontal part HP of the second semiconductor layer SEL2.

Referring to FIG. 17, a fourth impurity of the second conductivity type may be implanted with a concentration that is higher than that of the second impurity in the well region 213 such that a well pickup region 215 includes the horizontal part HP of the second semiconductor layer SEL2.

The well region 313 may remain at the periphery of the source pickup region 217, shown in FIG. 16, and the well pickup region 215, shown in FIG. 17, and may remain in the protrusion part PP of the second semiconductor layer SEL2.

Figure 18A:
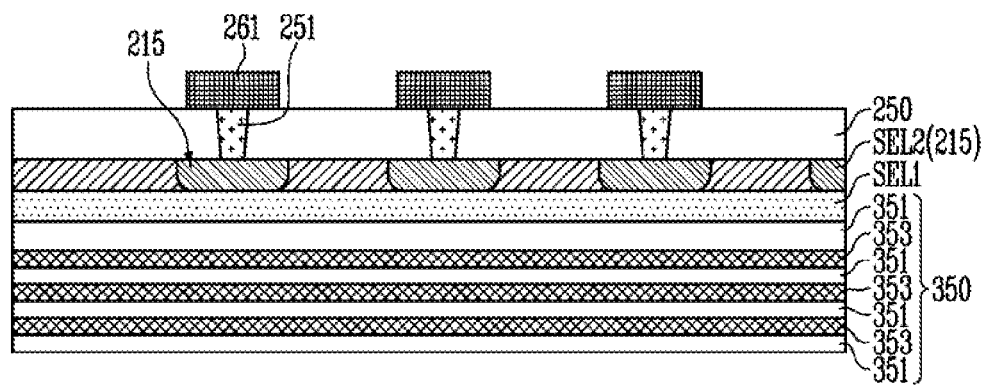
FIGS. 18A and 18B are sectional views illustrating an embodiment of subsequent processes performed on the region AR2, shown in FIG. 10A, and the region AR3, shown in FIG. 10B, after the processes, shown in FIGS. 16 and 17.
Figure 18B:
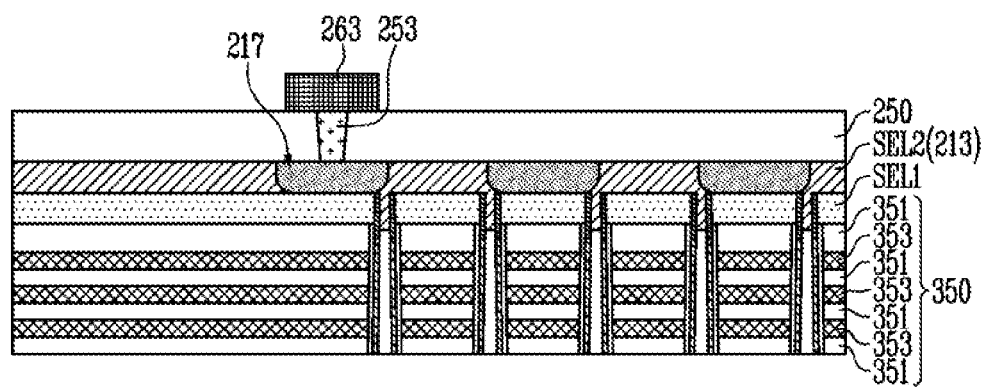

FIGS. 18A and 18B are sectional views illustrating an embodiment of subsequent processes performed on the region AR2, shown in FIG. 10A, and the region AR3, shown in FIG. 10B, after the processes, shown in FIGS. 16 and 17.

Referring to FIGS. 18A and 18B, an upper insulating layer 250 may be formed on the second semiconductor layer SEL2. Subsequently, a well pickup contact 251 and a source pickup contact 253 may be formed, which penetrate the upper insulating layer 250. The well pickup contact 251 may be connected to the well pickup region 215, and the source pickup contact 253 may be connected to the source pickup region 217.

Subsequently, a first upper line 261 and a second upper line 263, which are connected to the well pickup contact 251 and the source pickup contact 253, may be formed on the upper insulating layer 250.

Figure 19:
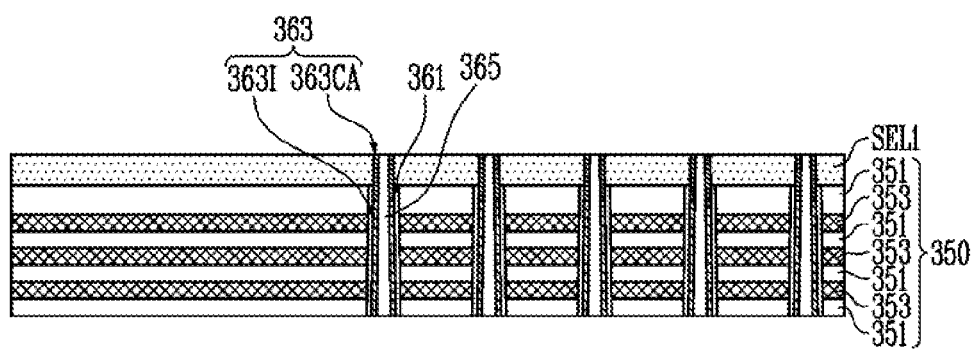
FIGS. 19 and 20 are sectional views illustrating an embodiment of subsequent processes performed after the process, shown in FIG. 13.
Figure 20:
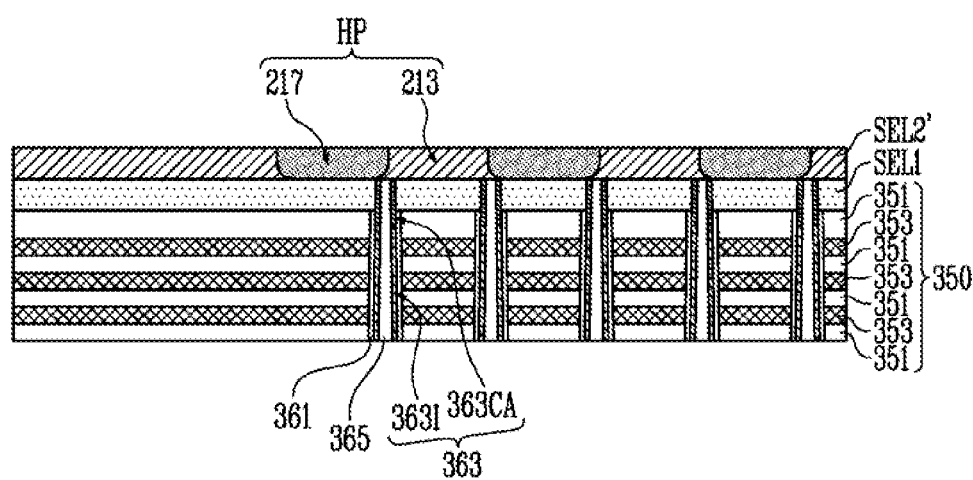

FIGS. 19 and 20 are sectional views illustrating an embodiment of subsequent processes performed after the process, shown in FIG. 13. FIGS. 19 and 20 are sectional views illustrating processes performed on the region AR3, shown in FIG. 10B.

Referring to FIG. 19, the first semiconductor layer SEL1 and the channel layer 363, which are shown in FIG. 13, may be planarized, thereby exposing the core insulating layer 365. The planarization may be performed through a Chemical Mechanical Polishing (CMP) process. Surfaces of the first semiconductor layer SEL1, the channel layer 363, and the core insulating layer 365 may be substantially disposed on the same line by the planarization. The first semiconductor layer SEL1 may remain to surround the channel impurity region 363CA of the channel layer 363, which protrudes farther than the stack structure 350 of the plurality of conductive patterns 353 and the plurality of interlayer insulating layers 351 and the memory layer 361. The first semiconductor layer SEL1 may remain in a state in which the first semiconductor layer SEL1 is in direct contact with a sidewall of the channel impurity region 363CA.

Referring to FIG. 20, as described with reference to FIGS. 15A and 15B, a second semiconductor layer SEL2' with a well region 213 may be formed on the first semiconductor layer SEL1. The second semiconductor layer SEL2' may be configured with a horizontal part HP that covers the planarized surfaces of the first semiconductor layer SEL1, the channel layer 363, and the core insulating layer 365. In an embodiment, an interface between the second semiconductor layer SEL2' and the channel layer 363 may be substantially disposed on the same line as that between the second semiconductor layer SEL2' and the core insulating layer 365. The well region 213 of the second semiconductor layer SEL2' may be in contact with a portion of the channel layer 363 that is opened between the core insulating layer 365 and the first semiconductor layer SEL1. In an embodiment, the well region 213 may be in contact with the channel impurity region 363CA of the channel layer 363.

Subsequently, as described with reference to FIG. 16, a process of implanting a third impurity may be performed such that a source pickup region 217 includes the horizontal part HP of the second semiconductor layer SEL2'. Subsequently, processes identical to those described with reference to FIGS. 17, 18A, and 18B may be performed.

Figure 21:
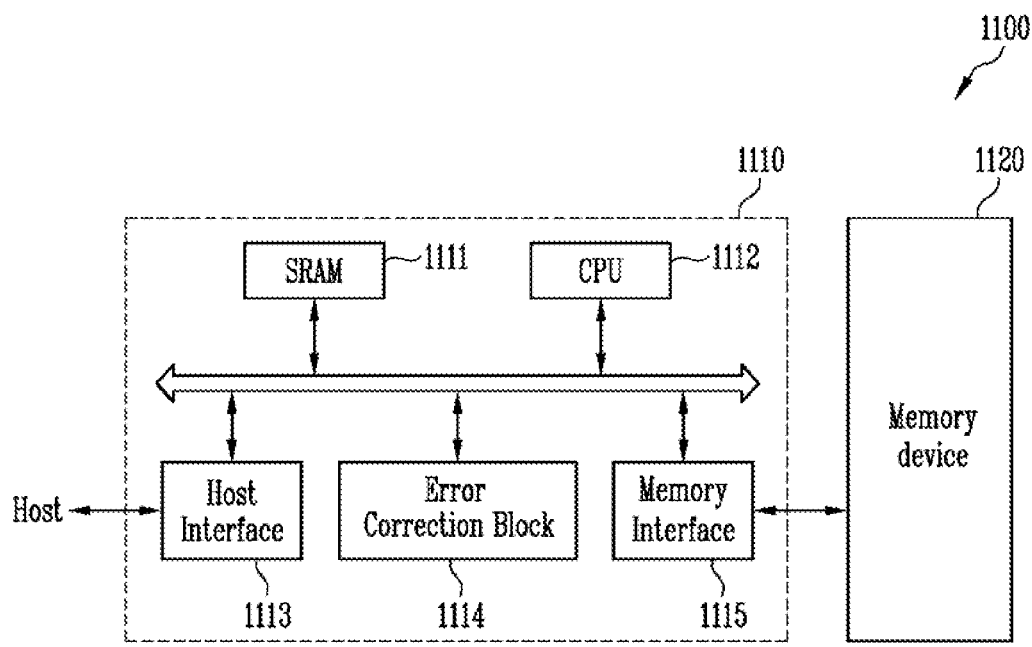
FIG. 21 is a block diagram illustrating a configuration of a memory system in accordance with an embodiment of the present disclosure.

FIG. 21 is a block diagram illustrating a configuration of a memory system in accordance with an embodiment of the present disclosure.

Referring to FIG. 21, the memory system 1100 includes a memory device 1120 and a memory controller 1110.

The memory device 1120 may be a multi-chip package configured with a plurality of flash memory chips. The memory device 1120 may include a first semiconductor layer and a second semiconductor layer, which are in contact with a channel layer of a memory cell array. The first semiconductor layer may include a first impurity of a first conductivity type, and a first impurity region may be in contact with the channel layer. The second semiconductor layer may include a well region of a second conductivity type that is different from the first conductivity type, and the well region may be in contact with the channel layer. The first semiconductor layer may be used as a current moving path in a read operation or a verify operation. The well region of the second semiconductor layer may be used as a current moving path in an erase operation.

The memory controller 1110 may control the memory device 1120, and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 performs overall control operations for data exchange of the memory controller 1110, and the host interface 1113 includes a data exchange protocol for a host connected with the memory system 1100. The error correction block 1114 may detect an error included in a data read from the memory device 1120, and corrects the detected error. The memory interface 1115 interfaces with the memory device 1120. The memory controller 1110 may further include a Read Only Memory (ROM) for storing code data for interfacing with the host, and the like.

The memory system 1100 that is configured as described above may be a memory card or a Solid State Disk (SSD), in which the memory device 1120 is combined with the controller 1110. For example, when the memory system 1100 is an SSD, the memory controller 1100 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 22:
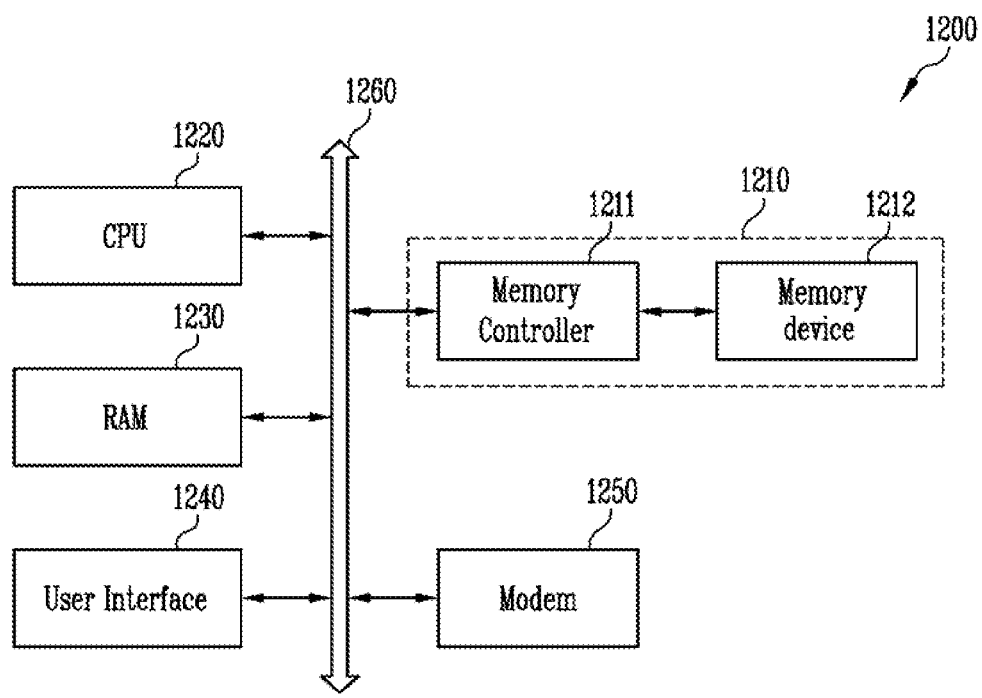
FIG. 22 is a block diagram illustrating a configuration of a computing system in accordance with an embodiment of the present disclosure.

FIG. 22 is a block diagram illustrating a configuration of a computing system in accordance with an embodiment of the present disclosure.

Referring to FIG. 22, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile D-RAM, and the like may be further included.

The memory system 1210 may be configured with a memory device 1212 and a memory controller 1211.

The memory device 1212 may include a first semiconductor layer and a second semiconductor layer, which are in contact with a channel layer of a memory cell array. The first semiconductor layer may include a first impurity of a first conductivity type, and a first impurity region may be in contact with the channel layer. The second semiconductor layer may include a well region of a second conductivity type that is different from the first conductivity type, and the well region may be in contact with the channel layer. The first semiconductor layer may be used as a current moving path in a read operation or a verify operation. The well region of the second semiconductor layer may be used as a current moving path in an erase operation.

The memory controller 1211 may be configured identically to the memory controller 1110, described above with reference to FIG. 21.

In accordance with the present disclosure, an erase operation based on majority carriers may be implemented, and thus the operational reliability of the semiconductor memory device may be improved.

What is claimed is:

1. A semiconductor memory device comprising:
   a stack structure including conductive patterns and interlayer insulating layers, which are alternately stacked in a first direction;
   a channel layer penetrating the stack structure;
   a first semiconductor layer disposed over the stack structure, the first semiconductor layer including a first impurity of a first conductivity type;
   a second semiconductor layer disposed over the first semiconductor layer, the second semiconductor layer including a well region with a second impurity of a second conductivity type, wherein the second conductivity type is different from the first conductivity type; and
   a memory layer between the channel layer and the stack structure,
   wherein the channel layer is in direct contact with the first semiconductor layer and the well region of the second semiconductor layer, and
   wherein the first semiconductor layer is located between the stack structure and the well region of the second semiconductor layer.

2. The semiconductor memory device of claim 1, wherein the channel layer includes a tubular semiconductor layer.

3. The semiconductor memory device of claim 2, wherein the second semiconductor layer includes:
   a horizontal part parallel to a top surface of the first semiconductor layer; and
   a protrusion part extending toward a central region of the tubular semiconductor layer from the horizontal part to be in direct contact with an inner wall of the tubular semiconductor layer.

4. The semiconductor memory device of claim 3, wherein the well region includes the protrusion part and a portion of the horizontal part of the second semiconductor layer.

5. The semiconductor memory device of claim 2, further comprising a core insulating layer filling a central region of the tubular semiconductor layer, the core insulating layer being in contact with the second semiconductor layer,
   wherein an interface between the second semiconductor layer and the channel layer and an interface between the second semiconductor layer and the core insulating layer are substantially disposed on the same line.

6. The semiconductor memory device of claim 1, wherein the second semiconductor layer further includes a source pickup region that is in contact with the first semiconductor layer, the source pickup region having a third impurity of the first conductivity type.

7. The semiconductor memory device of claim 6, wherein a concentration of the third impurity in the source pickup region is higher than that of the first impurity in the first semiconductor layer.

8. The semiconductor memory device of claim 6, further comprising an upper line connected to the first semiconductor layer via the source pickup region, the upper line transmitting a source voltage during a read operation or a verify operation.

9. The semiconductor memory device of claim 1, wherein the second semiconductor layer further includes a well pickup region including a fourth impurity of the second conductivity type.

10. The semiconductor memory device of claim 9, wherein a concentration of the fourth impurity in the well pickup region is higher than that of the second impurity in the well region.

11. The semiconductor memory device of claim 9, further comprising an upper line connected to the well region via the well pickup region, the upper line transmitting an erase voltage during an erase operation.

12. The semiconductor memory device of claim 1, wherein a portion of the channel layer that is in contact with the first semiconductor layer is doped with a channel impurity of the second conductivity type.

13. The semiconductor memory device of claim 1, further comprising:
a peripheral circuit structure overlapping with the stack structure; and
a bit line disposed between the peripheral circuit structure and the stack structure, the bit line being connected to the channel layer.

14. A semiconductor memory device comprising:
a stack structure including conductive patterns and interlayer insulating layers, which are alternately stacked in a first direction;
a channel layer penetrating the stack structure;
a first semiconductor layer disposed over the stack structure, the first semiconductor layer including a first impurity of a first conductivity type;
a second semiconductor layer disposed over the first semiconductor layer, the second semiconductor layer including a well region with a second impurity of a second conductivity type, wherein the second conductivity type is different from the first conductivity type; and
a memory layer between the channel layer and the stack structure,
wherein the channel layer is in direct contact with the first semiconductor layer and the well region of the second semiconductor layer,
wherein the channel layer includes a first part penetrating the stack structure and a second part extending in the first direction from the first part, and
wherein the first semiconductor layer is in direct contact with the second part of the channel layer, the first semiconductor layer surrounding the second part of the channel layer.

15. A method of manufacturing a semiconductor memory device, the method comprising:
forming a cell plug with a memory layer that extends along a surface of a channel hole and a channel layer that is disposed on the memory layer in the channel hole, wherein the channel hole penetrates conductive patterns and interlayer insulating layers, which are alternately stacked over a substrate, and extends into the substrate;
removing the substrate to expose a portion of the memory layer;
removing the exposed portion of the memory layer to expose a portion of the channel layer;
forming a first semiconductor layer that surrounds the exposed portion of the channel layer, the first semiconductor layer including a first impurity of a first conductivity type; and
forming a second semiconductor layer over the first semiconductor layer, the second semiconductor layer including a well region in direct contact with the first semiconductor layer and the channel layer,
wherein the well region of the second semiconductor layer includes a second impurity of a second conductivity type, the second conductivity type being different from the first conductivity type.

16. The method of claim 15, wherein the cell plug further includes a core insulating layer disposed in a central region of the channel hole, the core insulating layer being surrounded by the channel layer.

17. The method of claim 16, further comprising planarizing the first semiconductor layer and the channel layer to expose the core insulating layer before the forming of the second semiconductor layer over the first semiconductor layer,
wherein the second semiconductor layer is in contact with the core insulating layer, and
wherein an interface between the second semiconductor layer and the channel layer and an interface between the second semiconductor layer and the core insulating layer are substantially disposed on the same line.

18. The method of claim 16, further comprising, before the forming of the second semiconductor layer over the first semiconductor layer:
planarizing the first semiconductor layer and the channel layer to expose the core insulating layer; and
removing a portion of the core insulating layer to open a portion of the central region of the channel hole,
wherein the well region of the second semiconductor layer fills the opened portion of the central region of the channel hole.

19. The method of claim 15, further comprising implanting a third impurity of the first conductivity type with a concentration that is higher than that of the first impurity into the second semiconductor layer to define a source pickup region in the second semiconductor layer.

20. The method of claim 15, further comprising implanting a fourth impurity of the second conductivity type with a concentration that is higher than that of the second impurity into the second semiconductor layer to define a well pickup region in the second semiconductor layer.

21. The method of claim 15, further comprising implanting a channel impurity of the second conductivity type into the exposed portion of the channel layer before the forming of the first semiconductor layer.

22. The method of claim 15, further comprising, before the substrate is removed:
forming a peripheral circuit structure with a plurality of transistors;
forming first conductive bonding patterns that are connected to the transistors;
forming second conductive bonding patterns that are connected to the cell plug and the conductive patterns; and bonding the second conductive bonding patterns to the first conductive bonding patterns.

\* \* \* \* \*